(12) United States Patent
Guo

(10) Patent No.: US 12,277,974 B2
(45) Date of Patent: *Apr. 15, 2025

(54) MEMORY DEVICE AND OPERATION THEREOF

(71) Applicant: YANGTZE MEMORY TECHNOLOGIES CO., LTD., Wuhan (CN)

(72) Inventor: Xiaojiang Guo, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/595,909

(22) Filed: Mar. 5, 2024

(65) Prior Publication Data
US 2024/0212759 A1 Jun. 27, 2024

Related U.S. Application Data

(63) Continuation of application No. 17/583,710, filed on Jan. 25, 2022, now Pat. No. 11,961,562, which is a
(Continued)

(51) Int. Cl.
*G11C 16/04* (2006.01)
*G11C 16/08* (2006.01)
(Continued)

(52) U.S. Cl.
CPC .......... *G11C 16/08* (2013.01); *G11C 16/0483* (2013.01); *G11C 16/26* (2013.01);
(Continued)

(58) Field of Classification Search
CPC ..... G11C 16/08; G11C 16/0483; G11C 16/26; G11C 16/30; G11C 16/32; H10B 43/27
(Continued)

(56) References Cited

U.S. PATENT DOCUMENTS

| | | |
|---|---|---|
| 3,656,119 A | 4/1972 | Baker |
| 3,736,521 A | 5/1973 | Baker |

(Continued)

FOREIGN PATENT DOCUMENTS

| | | |
|---|---|---|
| CN | 101345088 A | 1/2009 |
| CN | 102446556 A | 5/2012 |

(Continued)

OTHER PUBLICATIONS

Extended European Search Report issued in corresponding International Application No. 21944416.3, mailed Jan. 18, 2024, 9 pages.
(Continued)

*Primary Examiner* — Ly D Pham
(74) *Attorney, Agent, or Firm* — BAYES PLLC

(57) ABSTRACT

A circuit includes a voltage generator and a sensing device. The voltage generator includes a first output and a second output. The first output is configured to output a word line voltage, and the second output is configured to output a flag signal indicates a relationship between the word line voltage and a reference signal. The sensing device includes a first input and a third output. The first input is coupled to the second output of the voltage generator, and the third output of the sensing device is configured to output a value corresponding to capacitance change of word line capacitance loading based on the flag signal.

20 Claims, 14 Drawing Sheets

Related U.S. Application Data continuation of application No. PCT/CN2021/137667, filed on Dec. 14, 2021.

(51) Int. Cl.
　　*G11C 16/26*　　(2006.01)
　　*G11C 16/30*　　(2006.01)
　　*G11C 16/32*　　(2006.01)
　　*H10B 43/27*　　(2023.01)

(52) U.S. Cl.
　　CPC .............. *G11C 16/30* (2013.01); *G11C 16/32* (2013.01); *H10B 43/27* (2023.02)

(58) Field of Classification Search
　　USPC .................................................... 365/185.21
　　See application file for complete search history.

(56) References Cited

U.S. PATENT DOCUMENTS

| | | | |
|---|---|---|---|
| 6,122,205 A | 9/2000 | Yach | |
| 6,542,412 B2 | 4/2003 | Ogura et al. | |
| 6,714,456 B1* | 3/2004 | Ogura | H10B 41/35 257/E27.103 |
| 9,165,647 B1* | 10/2015 | Guliani | G11C 8/14 |
| 10,475,812 B2* | 11/2019 | Harari | H01L 23/53257 |
| 11,205,480 B1 | 12/2021 | Giduturi | |
| 2002/0126550 A1 | 9/2002 | Sugio | |
| 2007/0047299 A1 | 3/2007 | Bovino et al. | |
| 2008/0310234 A1 | 12/2008 | Lee et al. | |
| 2012/0069653 A1 | 3/2012 | Morikado | |
| 2014/0241063 A1 | 8/2014 | Maeda | |
| 2016/0217853 A1 | 7/2016 | Guliani et al. | |
| 2016/0307630 A1 | 10/2016 | Choo et al. | |
| 2019/0319044 A1 | 10/2019 | Harari | |
| 2020/0258556 A1 | 8/2020 | Date | |
| 2020/0321046 A1 | 10/2020 | Cho et al. | |
| 2021/0027837 A1* | 1/2021 | Kim | G11C 13/0061 |

FOREIGN PATENT DOCUMENTS

| | | |
|---|---|---|
| CN | 110600069 A | 12/2019 |
| CN | 112102872 A | 12/2020 |
| CN | 113196402 A | 7/2021 |
| JP | 2010537360 A | 12/2010 |
| JP | 2013122804 A | 6/2013 |
| JP | 2020529096 A | 10/2020 |
| TW | 200304146 A | 9/2003 |

OTHER PUBLICATIONS

International Search Report issued in corresponding International Application No. PCT/CN2021/137667, mailed Aug. 31, 2022, 4 pages.

* cited by examiner

MEMORY DEVICE AND OPERATION THEREOF

CROSS-REFERENCE TO RELATED APPLICATIONS

This application is a continuation of U.S. application Ser. No. 17/583,710, filed on Jan. 25, 2022, entitled "MEMORY DEVICE AND OPERATION THEREOF," issued as U.S. Pat. No. 11,961,562, which is a continuation of International Application No. PCT/CN2021/137667, filed on Dec. 14, 2021, entitled "MEMORY DEVICE AND OPERATION THEREOF," both of which are hereby incorporated by reference in their entireties.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. For NAND Flash memory, an erase operation can be performed at the block level, and a program operation or a read operation can be performed at the page level.

SUMMARY

In one aspect, a memory device includes an array of memory cells in a plurality of memory strings and arranged in a plurality of rows of memory cells. The memory device also includes a plurality of word lines respectively coupled to the plurality of rows of memory cells, and a peripheral circuit coupled to the plurality of word lines and configured to perform a read operation on a selected row of memory cells of the plurality of rows of memory cells. The selected row of memory cells is coupled to a selected word line, wherein the peripheral circuit is configured to apply a word line voltage on each of the plurality of word lines and determine a highest threshold voltage of the plurality of rows of memory cells based on a change of a word line capacitance loading in response to the word line voltage.

In another aspect, a system includes a memory device configured to store data. The memory device includes an array of memory cells in a plurality of memory strings and arranged in a plurality of rows of memory cells, a plurality of word lines respectively coupled to the plurality of rows of memory cells, and a peripheral circuit coupled to the plurality of word lines and configured to perform a read operation on a selected row of memory cells of the plurality of rows of memory cells. The selected row of memory cells is coupled to a selected word line. The peripheral circuit is configured to, apply a word line voltage on each of the plurality of word lines, and determine a highest threshold voltage of the plurality of rows of memory cells based on a change of a word line capacitance loading in response to the word line voltage. The system also includes a memory controller coupled to the memory device and configured to control the memory device.

In still another aspect, a method for operating a memory device includes an array of memory cells in a plurality of memory strings and arranged in a plurality of rows of memory cells; and a plurality of word lines respectively coupled to the plurality of rows of memory cells. The method includes performing a read operation on a selected row of memory cells of the plurality of rows of memory cells. The selected row of memory cells is coupled to a selected word line. The performing the read operation includes, applying a word line voltage on each of the plurality of word lines, and determining a highest threshold voltage of the plurality of rows of memory cells based on a change of a word line capacitance loading in response to the word line voltage.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
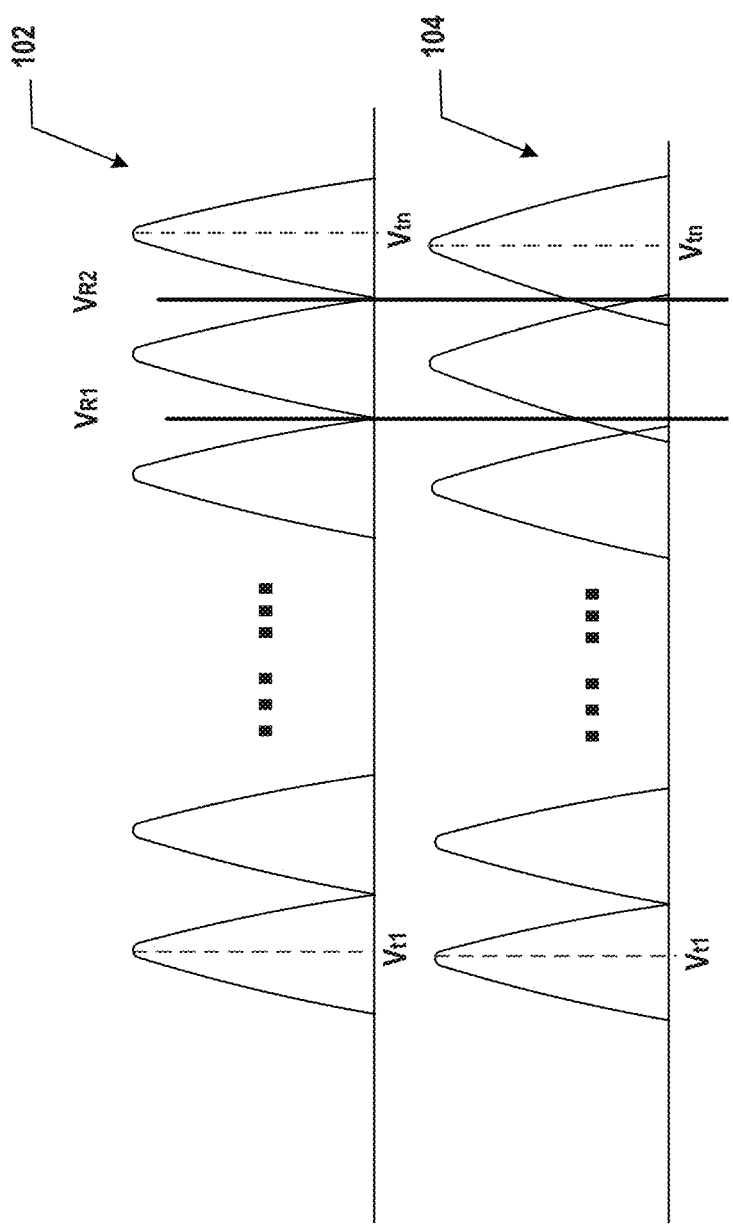
FIG. 1 illustrates threshold voltage distributions of memory cells in a memory device.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

In some memory devices, such as 3D NAND Flash memory devices, a memory cell is formed by the intersection between a word line and a semiconductor channel. One memory cell can be programmed to have multiple states, e.g., threshold voltages, and can thus store multiple bits of data per memory cell. In a triple-level cell (TLC) Flash memory device, a memory cell can be programmed to include eight threshold voltages, e.g., L0, L1, . . . , L7, to store 3 bits of data; and in a quad-level cell (QLC) Flash memory device, a memory cell can be programmed to include sixteen threshold voltages, e.g., L0, L1, . . . , L15, to store 4 bits of data. In a read operation of a 3D NAND Flash memory device, all word lines need to be ramped up to a high word line voltage to fully turn on the semiconductor channels. An important voltage for the read operation is the highest threshold voltage for programming the memory cells. For example, for a TLC Flash memory device and a QLC Flash memory device, respectively, the highest threshold voltage can be the L7 threshold voltage and the L15 threshold voltage. When the word line voltage reaches the highest threshold voltage, some operations can be performed based on the time the word line voltage reaches the highest threshold voltage and/or the value of the highest threshold voltage. The highest threshold voltage can be a critical transition point during the ramp-up process and is thus, very desirable for the read operation performed on a 3D NAND memory device.

This transition point can be used to trigger other array operations. For example, it is critical to obtain the time when the word line voltage reaches the highest threshold voltage. When the word line voltage increases, select gates such as source-select gates (e.g., bottom-select gates or BSG) and drain-select gates (top-select gates or TSGs) of the semiconductor channels are also turned on to allow all the semiconductor channels to undergo a "reset", e.g., a cleanup process to remove undesirable carries in the semiconductor channels to avoid hot carrier injection (HCI). After the word line voltage reaches the highest threshold voltage, unselected select gates can then be turned off. Power consumption can be reduced, and the semiconductor channels are conditioned for the data access of the read operation. During the read operation, the unselected word lines are applied with a high voltage, e.g., a pass voltage (Vpass), that is determined based on the highest threshold voltage. Vpass is often determined, e.g., optimized, by adding an overdrive voltage to the highest threshold voltage. An optimized Vpass can reduce read disturbance during a read operation. Further, memory cells may lose charge with time. The phenomenon is also referred to as retention charge loss. The threshold voltage distributions, especially the higher threshold voltage distributions, can shift down, e.g., to lower voltage distributions, over time. The retention information can be obtained based on the highest threshold voltage of the memory cells. For example, a shift of the highest threshold voltage can be employed to adjust the read reference voltage used to read data. This will help reduce read errors in a read operation.

The highest threshold voltage of the memory cells is often measured after the memory devices are manufactured, and the other voltage and timing are designed based on the result of the measurement. However, the value of the measured highest threshold voltage lacks accuracy because of at least the following reasons. For example, the driver used for driving the word lines can cause a voltage drop of the word line voltages. The voltage drop may vary based on design and factors such as processing, voltage, and temperature. The Vpass applied on the unselected word lines thus may not be sufficiently accurate to reduce disturbance during a read operation. Also, when a read reference voltage is applied between adjacent threshold voltages to read the data in a memory cell, a shift in threshold voltage distributions may require the read reference voltage to be changed/adjusted from its manufacturer's value, such that the read reference voltage has sufficient margins to adjacent threshold voltages for an accurate read operation. That is, a read reference voltage set at the manufacturer, when used, may be susceptible to causing read error if not adjusted over time.

FIG. 1 illustrates threshold voltage distributions in a memory device, e.g., a 3D NAND Flash memory device, at two different times. The x-axis represents values of threshold voltages, and the y-axis represents cell distribution. As an example, distributions 102 represent the threshold voltage distributions of TLC memory cells or QLC memory cells at time t1, and distributions 104 represent the threshold voltage distributions of the TLC memory cells or QLC memory cells at time t2. Time t1 represents an earlier time. $V_{t1}$ represents the lowest threshold voltage for erase operation, e.g., L0 for TLC and QLC memory cells. $V_{tn}$ represents the highest threshold voltage, e.g., L7 for TLC memory cells and L15 for QLC memory cells. Time t2 may be a time after t1, and an interval between times t2 and t1 is greater than 0, e.g., a few hours, a week, a month, a few months, etc. Read reference voltages $V_{R1}$ and $V_{R2}$, each located between adjacent threshold voltage distributions, are applied on a selected word line at time t1 for read operations. As shown in FIG. 1, compared to at time t1, the threshold voltage distributions 104 shift to lower voltage distributions at time t2 and becomes wider. As a result, read reference voltages $V_{r1}$ and $V_{r2}$ may not have sufficient margins to adjacent threshold voltages, and the read operation using read reference voltages $V_{r1}$ and $V_{r2}$ can be susceptible to read error.

Figure 2:
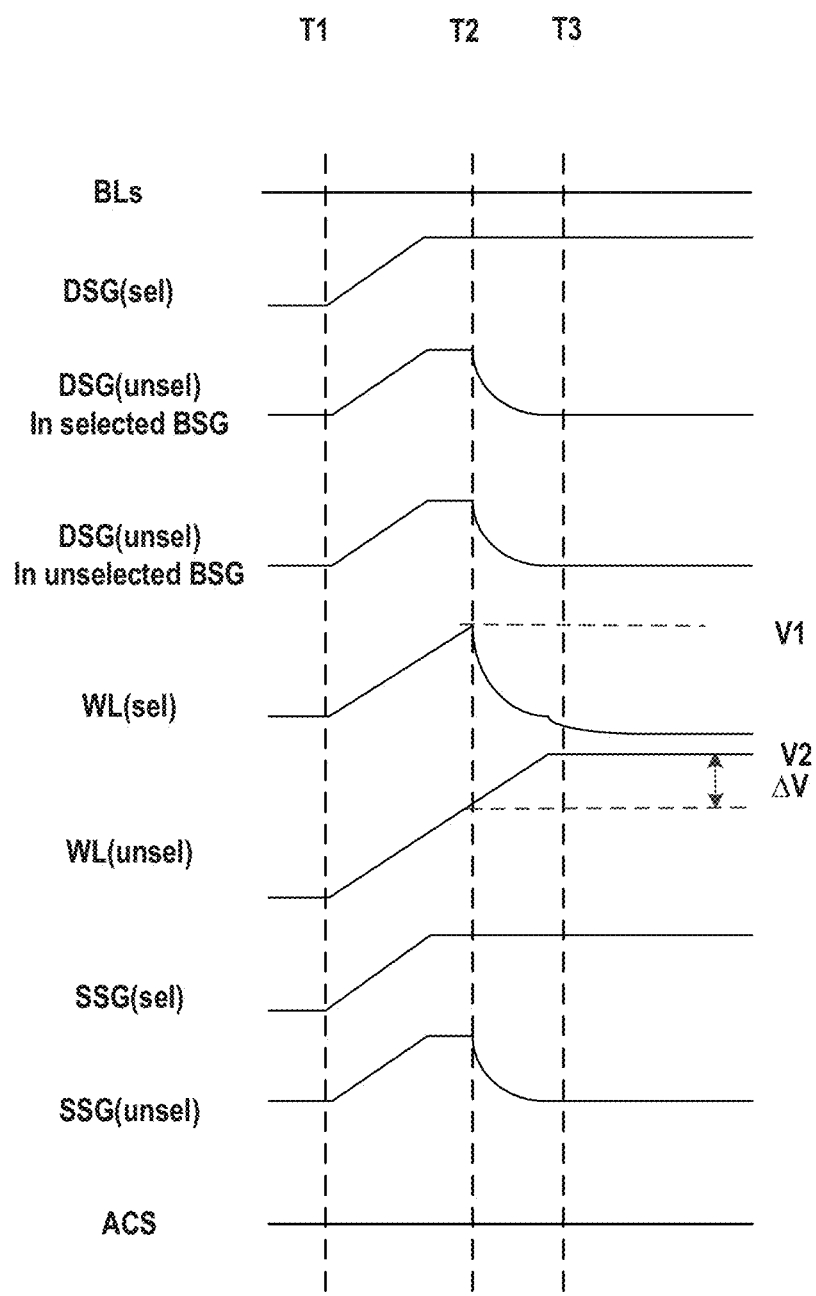
FIG. 2 illustrates a timing diagram of a plurality of voltages employed in a read operation in a memory device, according to some aspects of the present disclosure.

FIG. 2 illustrates a timing diagram of a plurality of voltages employed in a read operation of a memory device, according to the present disclosure. The memory device may include a 3D NAND Flash memory device. Specifically, time T1 to time T2 may be regarded as an initialization period or reset period of the read operation. In this period, the channel structures go through a reset or initialization process, and certain voltages start to ramp up and to respective initialization values. Time T2 to time T3 may be regarded as a trimmable delay period. At time T2, the initialization/reset process is completed, and the voltages start to change and approach the values at which data are read out from the memory cells. At time T3, the voltages reach the values for reading out the data. From time T3, data are read out from the memory cells formed by the channel structures. As shown in FIG. 2, voltages applied on the bit lines ("BLs"), and source lines ("ACS") are low during the read operation to turn off the bit lines and the source lines. Voltages on the select gates in a memory block, e.g., selected drain-select gate ("DSG(sel)"), unselected drain-select gate corresponding to selected bottom-select gate ("DSG(unsel) in selected SSG"), unselected drain-select gate corresponding to unselected source-select gate ("DSG(unsel) in unselected SSG"), selected source-select gate ("SSG(sel)"), and unselected source-select gate ("SSG(unsel)") start to increase from a low value to a high value (e.g., a turn-on voltage value). Between time T1 and T2, voltages applied on the above select gates reach the respective high value and maintain the high values for a period of time for the initialization/reset of the channel structures.

A word line voltage, i.e., the voltage applied on the word lines, selected word lines ("WL(sel)") and unselected word lines ("WL(unsel)"), also starts to increase from a lower value at time T1 and reaches a higher value V1 at time T2. The value of V1 may be equal to or higher than the highest threshold voltage of the memory cells. At time T2, the voltages on DSG (unsel) In selected SSG, DSG (unsel) in unselected SSG, and SSG (unsel) start to decrease to a low value (e.g., a turn off voltage value) by time T3, while the voltages on DSG (sel) and SSG (sel) remain high (e.g., a turn-on voltage value) for the rest of the read operation. At time T2, the channel structures are on and reset/initialized from ACS and BLs. From time T2, the voltage on WL(sel) starts to decrease to a low value (e.g., a turn-off voltage value), while the voltage on WL(unsel) keeps increasing to a higher value V2 by time T3. V2 is also referred to as a Vpass voltage. The voltage of V2 applied on WL(unsel) maintains for the rest of the read operation.

In some memory devices, the value of V1 is measured after the memory device is manufactured. V1, equal to or sufficiently close to the highest threshold voltage of the memory cells, is used to determine time T2, e.g., at which certain select gates are turned off. For example, certain select gates are turned off when the word line voltage reaches V1. Meanwhile, the value of V1 is also used to determine the value V2. For example, V2 is often determined by adding an overdrive value ΔV over V1. Because V1 is a value measured after being manufactured and does not represent the shift of threshold voltage distributions over time in the memory cells, certain parameters, such as the time to turn off certain select gates, the value of V2, and the read reference voltage(s), determined based on V1 may not be accurate. The operation to determine a more accurate highest threshold voltage is desired.

To address one or more of the aforementioned issues, the present disclosure provides a memory device and a method for obtaining the highest threshold voltage of memory cells at a desired time. The method may include an automatic detection scheme in which the highest threshold voltage can be obtained in real-time, or can be obtained at a desired time and stored for the next read operation. The time that the word line voltage reaches the highest threshold voltage and the value of the highest threshold voltage may be more accurate. The value of the highest threshold voltage and the time a word line voltage reaches the highest threshold voltage can thus be employed to determine other parameters, such as the time to turn off certain select gates, the value of Vpass, and the values of read reference voltages, which can more accurate as well. The read operation performed in the memory device is less susceptible to disturbance and error.

According to the present disclosure, the word line capacitance loading, formed by the word lines and the channel structures, can be equivalent to a variable capacitance when the word line voltage increases. When the word line voltage reaches the highest threshold voltage, the capacitance reaches its maximum value, i.e., the maximum capacitance. The capacitance of the word line capacitance loading can further stay unchanged or decrease after reaching the maximum capacitance. By detecting the change of capacitance of the word line capacitance loading, the time the word line voltage reaches the highest threshold voltage and the value of the highest threshold voltage can be obtained in a real-time manner.

To automatically detect the change of capacitance of the word line capacitance loading, a pumping time of a voltage generator that outputs the word line voltage is obtained. The voltage generator includes a comparing circuit that allows the voltage generator to keep increasing the word line voltage by steps until the highest threshold voltage, e.g., the maximum capacitance of the word line capacitance loading, is reached. A sensing device is employed to detect the capacitance change of the word line capacitance loading at each step. Control logic of the memory device is employed to compare the capacitance change at two adjacent values of the word line voltage. When a maximum capacitance change is detected, the maximum capacitance is detected. Accordingly, the word line voltage corresponding to the maximum capacitance is determined to be the highest threshold voltage. The control logic is then employed to control other operations based on the time the word line voltage reaches the highest threshold voltage and the value of the highest threshold voltage.

In some implementations, the sensing device includes a counter. The counter is coupled to the voltage generator and has an input of a flag signal that indicates the pumping time of the voltage generator at each step. The output of the counter includes a plurality of values each indicating the pumping time of the voltage generator at a respective step. Because the pumping time at each step is associated with the capacitance charged to the word line capacitance loading during the respective step, the output of the counter represents the capacitance change of the word line capacitance loading at each of the steps. In some implementations, the counter includes an AND gate coupled to a plurality of flip flops. In other implementations, the memory device includes a sensing device that is configured to detect the electric current flowing from the voltage generator to the word line capacitance loading. The control logic can determine the highest threshold voltage based on the electric current.

Figure 3:
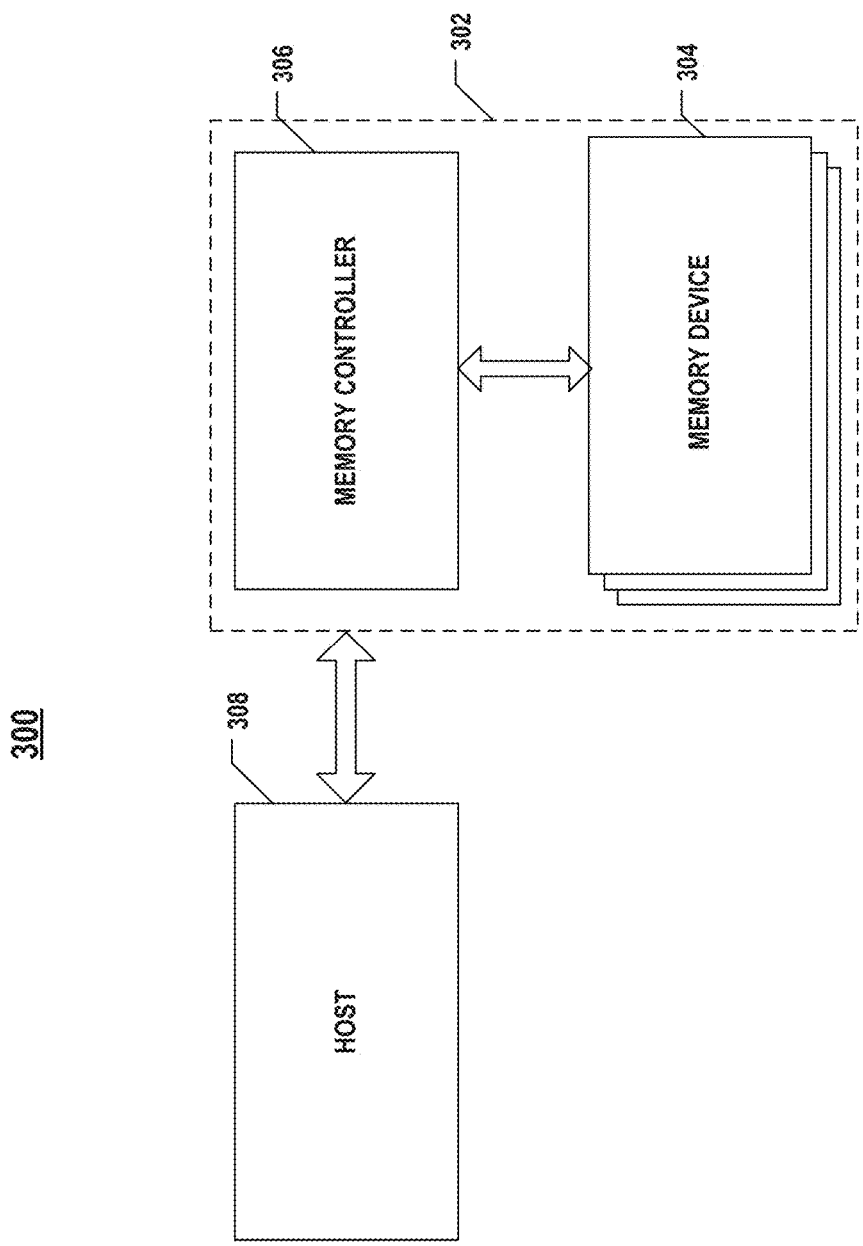
FIG. 3 illustrates a block diagram of an exemplary system having a memory device, according to some aspects of the present disclosure.

FIG. 3 illustrates a block diagram of an exemplary system 300 having a memory device, according to some aspects of the present disclosure. System 300 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 3, system 300 can include a host 308 and a memory system 302 having one or more memory devices 304 and a memory controller 306. Host 308 can be a processor of an electronic device, such as a central processing unit (CPU), or a system-on-chip (SoC), such as an application processor (AP). Host 308 can be configured to send or receive data to or from memory devices 304.

Memory device 304 can be any memory device disclosed in the present disclosure. As disclosed below in detail, memory device 304, such as a NAND Flash memory device, for example, a three-dimensional (3D) NAND Flash memory device, can automatically obtain the highest threshold voltage of the memory cells at a desired time and determine other operations based on the timing and value of the threshold voltage. In some implementations, memory device 304 obtains the highest threshold voltage of the memory cells as part of each read operation. In some implementations, memory device 304 obtains the highest threshold voltage of the memory cells and stores it for subsequent read operations.

Memory controller 306 is coupled to memory device 304 and host 308 and is configured to control memory device 304, according to some implementations. Memory controller 306 can manage the data stored in memory device 304 and communicate with host 308. In some implementations, memory controller 306 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 306 is designed for operating in a high duty-cycle environment SSDs or embedded multi-media-cards (eMMCs) used as data storage for mobile devices, such as smartphones, tablets, laptop computers, etc., and enterprise storage arrays. Memory controller 306 can be configured to control operations of memory device 304, such as read, erase, and program operations. Memory controller 306 can also be configured to manage various functions with respect to the data stored or to be stored in memory device 304 including, but not limited to bad-block management, garbage collection, logical-to-physical address conversion, wear leveling, etc. In some implementations, memory controller 306 is further configured to process error correction codes (ECCs) with respect to the data read from or written to memory device 304. Any other suitable functions may be performed by memory controller 306 as well, for example, formatting memory device 304. Memory controller 306 can communicate with an external device (e.g., host 308) according to a particular communication protocol. For example, memory controller 306 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 4A:
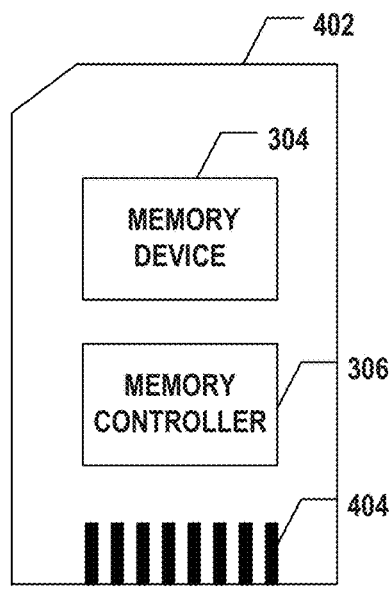
FIG. 4A illustrates a diagram of an exemplary memory card having a memory device, according to some aspects of the present disclosure.
Figure 4B:
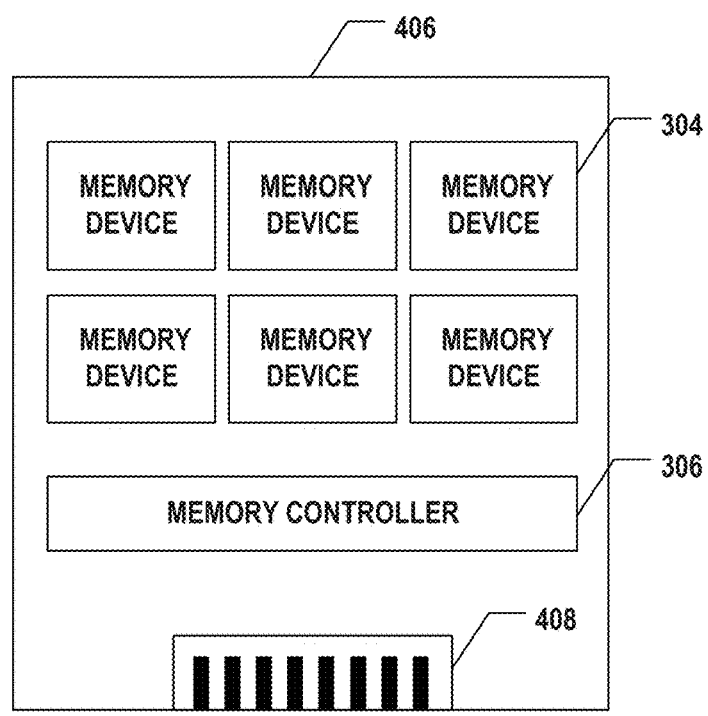
FIG. 4B illustrates a diagram of an exemplary solid-state drive (SSD) having a memory device, according to some aspects of the present disclosure.

Memory controller 306 and one or more memory devices 304 can be integrated into various types of storage devices, for example, be included in the same package, such as a universal Flash storage (UFS) package or an eMMC package. That is, memory system 302 can be implemented and packaged into different types of end electronic products. In one example as shown in FIG. 4A, memory controller 306 and a single memory device 304 may be integrated into a memory card 402. Memory card 402 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 402 can further include a memory card connector 404 coupling memory card 402 with a host (e.g., host 308 in FIG. 3). In another example as shown in FIG. 4B, memory controller 306 and multiple memory devices 304 may be integrated into an SSD 406. SSD 406 can further include an SSD connector 408 coupling SSD 406 with a host (e.g., host 308 in FIG. 3). In some implementations, the storage capacity and/or the operation speed of SSD 406 is greater than those of memory card 402.

Figure 5:
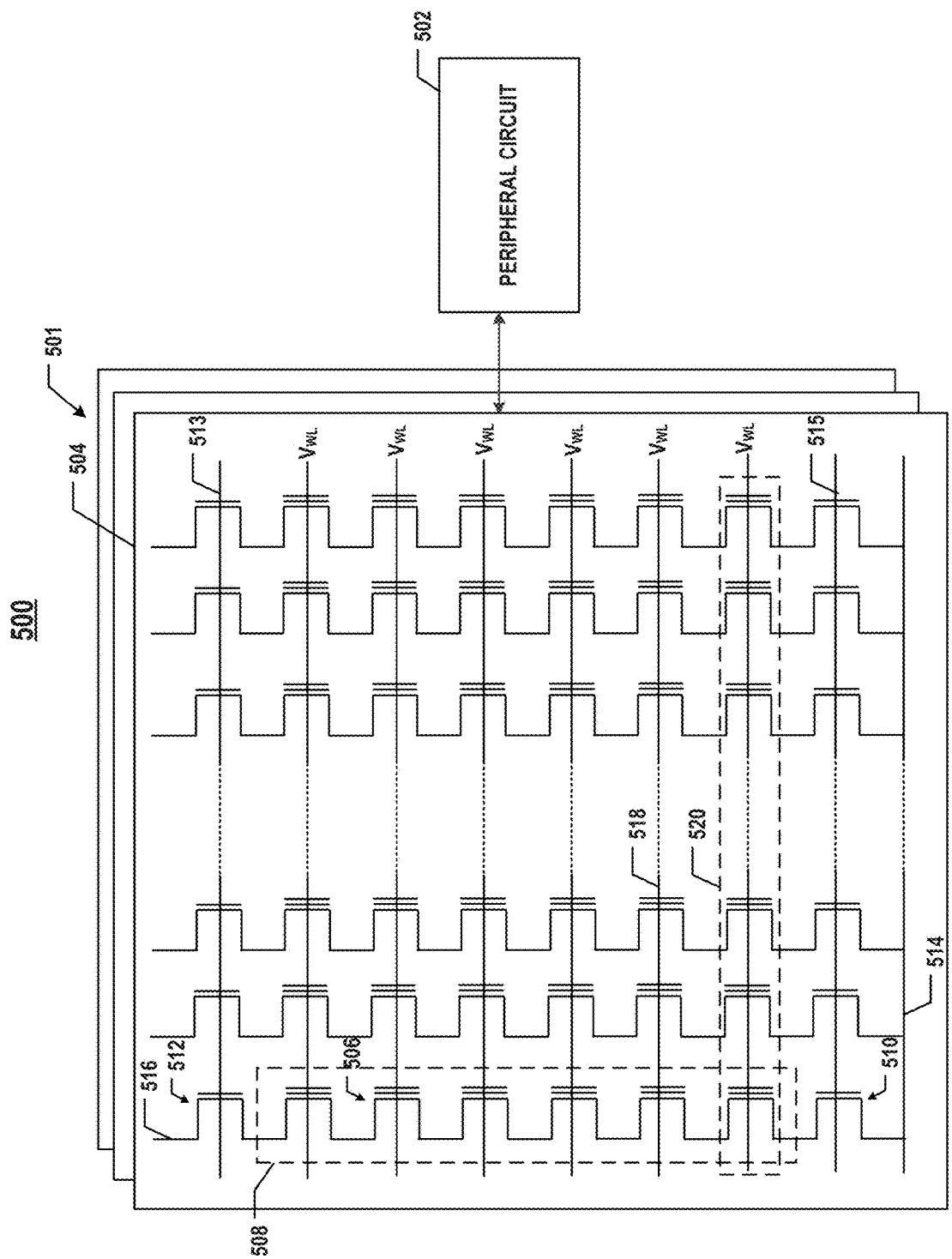
FIG. 5 illustrates a schematic diagram of an exemplary memory device including peripheral circuits, according to some aspects of the present disclosure.

FIG. 5 illustrates a schematic circuit diagram of an exemplary memory device 500 including peripheral circuits, according to some aspects of the present disclosure. Memory device 500 can be an example of memory device 304 in FIG. 3. Memory device 500 can include a memory cell array 501 and peripheral circuits 502 coupled to memory cell array 501. Memory cell array 501 can be a NAND Flash memory cell array in which memory cells 506 are provided in the form of an array of NAND memory strings 508 each extending vertically above a substrate (not shown). In some implementations, each NAND memory string 508 includes a plurality of memory cells 506 coupled in series and stacked vertically. Each memory cell 506 can hold a continuous, analog value, such as an electrical voltage or charge, that depends on the number of electrons trapped within a region of memory cell 506. Each memory cell 506 can be either a floating gate type of memory cell including a floating-gate transistor or a charge trap type of memory cell including a charge-trap transistor.

In some implementations, each memory cell 506 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 506 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 5 each NAND memory string 508 can include a source-select gate (SSG) 510 at its source end and a drain-select gate (DSG) 512 at its drain end. SSG 510 and DSG 512 can be configured to activate selected NAND memory strings 508 (columns of the array) during read and program operations. In some implementations, SSG 510 is also referred to as BSG, and DSG 512 is also referred to as TSG. In some implementations, the sources of NAND memory strings 508 in the same block 504 are coupled through a same source line (SL) 514, e.g., a common SL. In other words, all NAND memory strings 508 in the same block 504 have an array common source (ASC), according to some implementations. DSG 512 of each NAND memory string 508 is coupled to a respective bit line 516 from which data can be read or written via an output bus (not shown), according to some implementations. In some implementations, each NAND memory string 508 is configured to be selected or deselected by applying a select voltage (e.g., above the threshold voltage of the transistor having DSG 512) or a deselect voltage (e.g., 0 V) to respective DSG 512 through one or more DSG lines 513 and/or by applying a select voltage (e.g., above the threshold voltage of the transistor having SSG 510) or a deselect voltage (e.g., 0 V) to respective SSG 510 through one or more SSG lines 515.

As shown in FIG. 5, NAND memory strings 508 can be organized into multiple blocks 504, each of which can have a common source line 514, e.g., coupled to the ACS. In some implementations, each block 504 is the basic data unit for erase operations, i.e., all memory cells 506 on the same block 504 are erased at the same time. In some implementations, each word line 518 is coupled to a page 520 of memory cells 506, which is the basic data unit for program operations and read operations. Memory cells 506 of adjacent NAND memory strings 508 can be coupled through word lines 518 that select which row of memory cells 506 is affected by read and program operations. The size of one page 520 in bits can relate to the number of NAND memory strings 508 coupled by word line 518 in one block 504. Each word line 518 can include a plurality of control gates (gate electrodes) at each memory cell 506 in respective page 520 and a gate line coupling the control gates.

In a read operation, data stored in page 520 can be accessed. When a read operation starts, referring back to FIG. 2, bit lines 516 and source line 514 in block 504 are biased at a low voltage, e.g., the ground (GND), and the voltages on all select gates (e.g., SSG 510 and DSG 512) and word lines (e.g., word lines 518) in block 504 start to ramp up. After the voltages on the select gates reach their respective high voltages, the voltages maintain for a period of time for channel reset/initialization. When the voltage on the word lines reaches the highest threshold voltage of memory cells 506, the voltages on the unselected select gates may start to decrease to a low voltage, the voltages on the selected select gates (e.g., the select gates employed to select page 520) maintain at the respective high voltage, the voltage on the selected word line (e.g., word line 518 coupled to page 520) starts to decrease to a low voltage, and the voltage on the unselected word lines continue to increase to Vpass. After the voltage on the unselected word lines reaches Vpass, page 520 is open, and data stored in page 520 can be accessed. In some implementations, a threshold voltage of the memory cells 506 is compared to a read reference voltage to determine the stored data. In some implementations, peripheral circuit 502 detects the time the highest threshold voltage is reached by the voltage on word lines 518 and changes the voltages on the select gates (e.g., the unselect SSG 510 and DSG 512). Peripheral circuit 502 also determines the values of Vpass and the read reference voltages based on the value of the highest threshold voltage. Bits in a flash cell are read by changing the voltages on rows and columns of memory cells followed by assessing the results. In a page read operation, the data stored in page 520 is moved from memory cell array 501 into an output data register.

Figure 6:
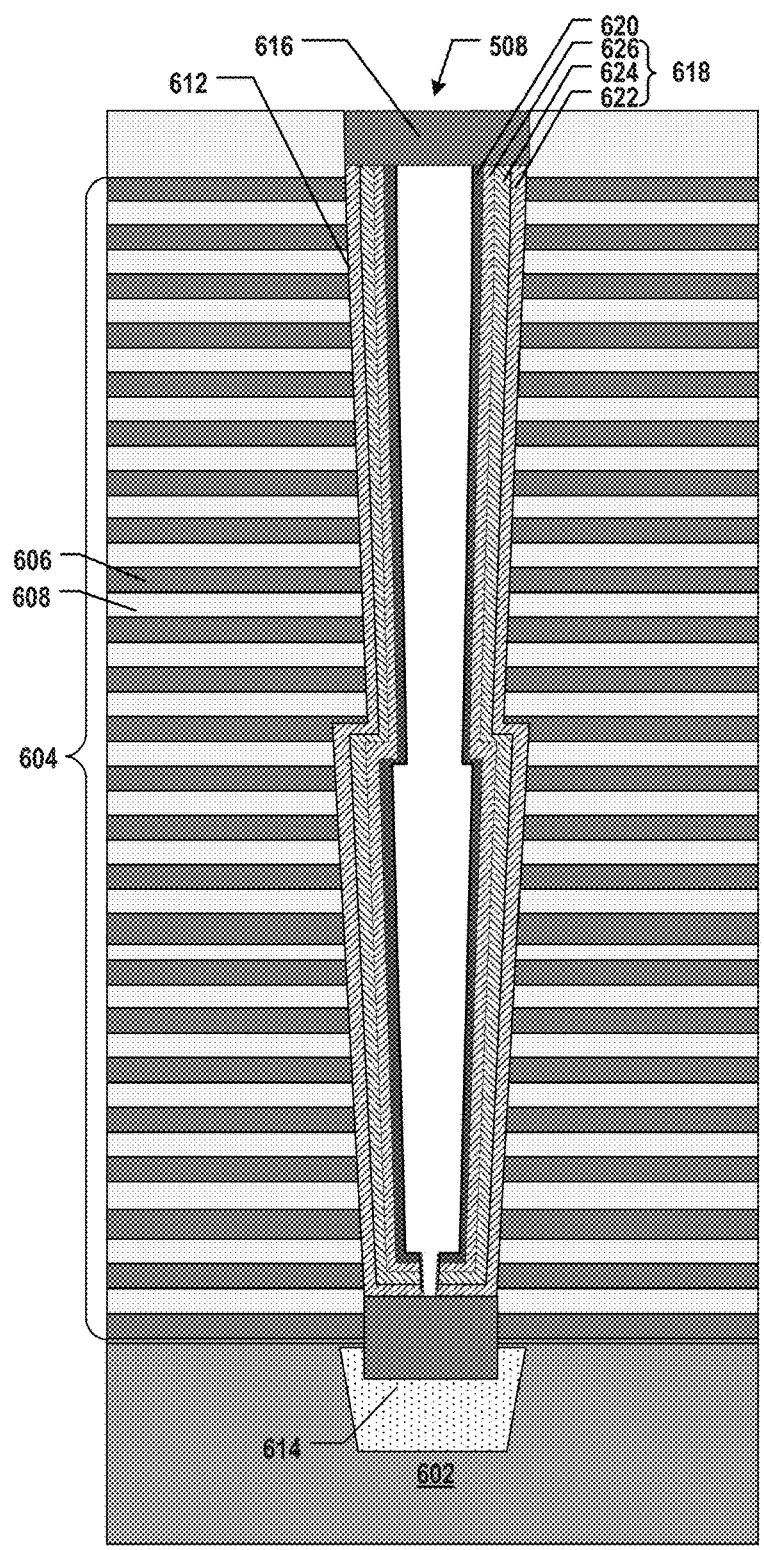
FIG. 6 illustrates a side view of a cross-section of an exemplary memory cell array including a NAND memory string, according to some aspects of the present disclosure.

FIG. 6 illustrates a side view of a cross-section of exemplary memory cell array 501 including NAND memory string 508, according to some aspects of the present disclosure. As shown in FIG. 6, NAND memory string 508 can extend vertically through a memory stack 604 above a substrate 602. Substrate 602 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 604 can include interleaved gate conductive layers 606 and gate-to-gate dielectric layers 608. The number of the pairs of gate conductive layers 606 and gate-to-gate dielectric layers 608 in memory stack 604 can determine the number of memory cells 506 in memory cell array 501. Gate conductive layer 606 can include conductive materials including, but not limited to, tungsten (W), cobalt (Co), copper (Cu), aluminum (Al), polysilicon, doped silicon, silicides, or any combination thereof. In some implementations, each gate conductive layer 606 includes a metal layer, such as a tungsten layer. In some implementations, each gate conductive layer 606 includes a doped polysilicon layer. Each gate conductive layer 606 can include control gates surrounding memory cells 506 and can extend laterally as DSG line 513 at the top of memory stack 604, SSG line 515 at the bottom of memory stack 604, or word line 518 between DSG line 513 and SSG line 515.

As shown in FIG. 6, NAND memory string 508 includes a channel structure 612 extending vertically through memory stack 604. In some implementations, channel structure 612 includes a channel hole filled with semiconductor material(s) (e.g., as a semiconductor channel 620) and dielectric material(s) (e.g., as a memory film 618). In some implementations, semiconductor channel 620 includes silicon, such as polysilicon. In some implementations, memory film 618 is a composite dielectric layer including a tunneling layer 626, a storage layer 624 (also known as a "charge trap/storage layer"), and a blocking layer 622. Channel structure 612 can have a cylinder shape (e.g., a pillar shape). Semiconductor channel 620, tunneling layer 626, storage layer 624, blocking layer 622 are arranged radially from the center toward the outer surface of the pillar in this order, according to some implementations. Tunneling layer 626 can include silicon oxide, silicon oxynitride, or any combination thereof. Storage layer 624 can include silicon nitride, silicon oxynitride, silicon, or any combination thereof. Blocking layer 622 can include silicon oxide, silicon oxynitride, high dielectric constant (high-k) dielectrics, or any combination thereof. In one example, memory film 618 may include a composite layer of silicon oxide/silicon oxynitride/silicon oxide (ONO).

As shown in FIG. 6, a well 614 (e.g., a P-well and/or an N-well) is formed in substrate 602, and the source end of NAND memory string 508 is in contact with well 614, according to some implementations, according to some implementations. For example, source line 514 may be coupled to well 614 to apply an erase voltage to well 614, i.e., the source of NAND memory string 508, during erase operations. In some implementations, NAND memory string 508 further includes a channel plug 616 at the drain end of NAND memory string 508. It is understood that although not shown in FIG. 6, additional components of memory cell array 501 can be formed including, but not limited to, gate line slits/source contacts, local contacts, interconnect layers, etc.

Figure 7A:
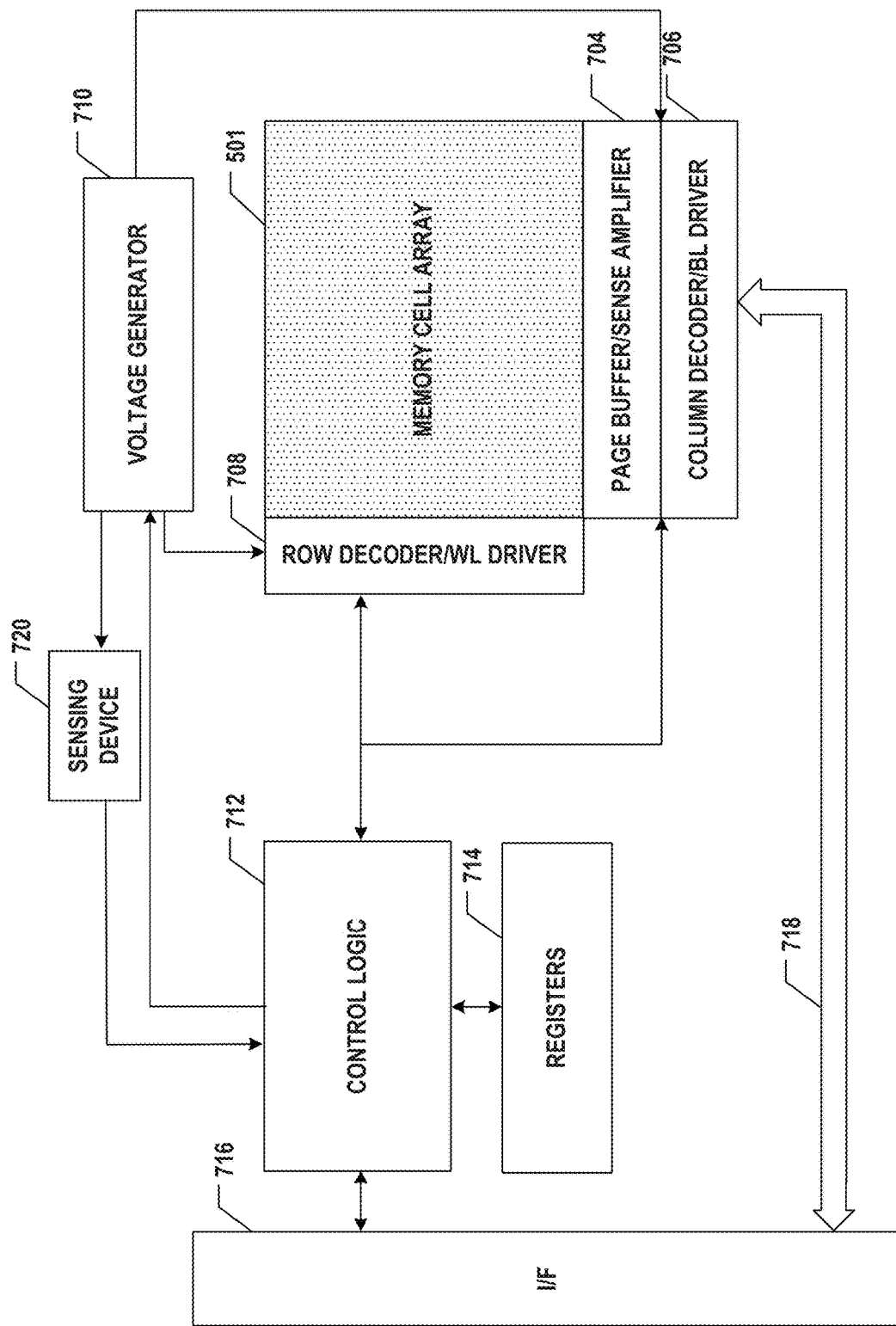
FIG. 7A illustrates a block diagram of an exemplary memory device including a memory cell array and peripheral circuits, according to some aspects of the present disclosure.

Referring back to FIG. 5, peripheral circuits 502 can be coupled to memory cell array 501 through bit lines 516, word lines 518, source lines 514, SSG lines 515, and DSG lines 513. Peripheral circuits 502 can include any suitable analog, digital, and mixed-signal circuits for facilitating the operations of memory cell array 501 by applying and sensing voltage signals and/or current signals to and from each target memory cell 506 through bit lines 516, word lines 518, source lines 514, SSG lines 515, and DSG lines 513. Peripheral circuits 502 can include various types of peripheral circuits formed using metal-oxide-semiconductor (MOS) technologies. For example, FIG. 7A illustrates some exemplary peripheral circuits including a page buffer/sense amplifier 704, a column decoder/bit line driver 706, a row decoder/word line driver 708, a voltage generator 710, control logic 712, registers 714, an interface 716, a data bus 718, and a sensing device 720. It is understood that in some examples, additional peripheral circuits not shown in FIG. 7A may be included as well.

Page buffer/sense amplifier 704 can be configured to read and program (write) data from and to memory cell array 501 according to the control signals from control logic 712. In one example, page buffer/sense amplifier 704 may store one page of program data (write data) to be programmed into one page 520 of memory cell array 501. In another example, page buffer/sense amplifier 704 may perform program verify operations to ensure that the data has been properly programmed into memory cells 506 coupled to selected word lines 518. In still another example, page buffer/sense amplifier 704 may also sense the low power signals from bit line 516 that represents a data bit stored in memory cell 506 and amplify the small voltage swing to recognizable logic levels in a read operation. Column decoder/bit line driver 706 can be configured to be controlled by control logic 712 and select one or more NAND memory strings 508 by applying bit line voltages generated from voltage generator 710.

Row decoder/word line driver 708 can be configured to be controlled by control logic 712 and select/deselect blocks 504 of memory cell array 501 and select/deselect word lines 518 of block 504. Row decoder/word line driver 708 can be further configured to drive word lines 518 using word line voltages generated from voltage generator 710. In some implementations, row decoder/word line driver 708 can also select/deselect and drive SSG lines 515 and DSG lines 513 as well. As described below in detail, row decoder/word line driver 708 is configured to perform an erase operation on memory cells 506 coupled to selected word line(s) 518. Voltage generator 710 can be configured to be controlled by control logic 712 and generate the word line voltages (e.g., read reference voltage, program voltage, pass voltage, local voltage, verification voltage, etc.), bit line voltages, and source line voltages to be supplied to memory cell array 501.

As part of peripheral circuits 502, control logic 712 can be coupled to other peripheral circuits described above and configured to control operations of other peripheral circuits. Registers 714 can be coupled to control logic 712 and include status registers, command registers, and address registers for storing status information, command operation codes (OP codes), and command addresses for controlling the operations of each peripheral circuit. Interface 716 can be coupled to control logic 712 and act as a control buffer to buffer and relay control commands received from a host (not shown) to control logic 712 and status information received from control logic 712 to the host. Interface 716 can also be coupled to column decoder/bit line driver 706 via data bus 718 and act as a data input/output (I/O) interface and a data buffer to buffer and relay the data to and from memory cell array 501.

Figure 7B:
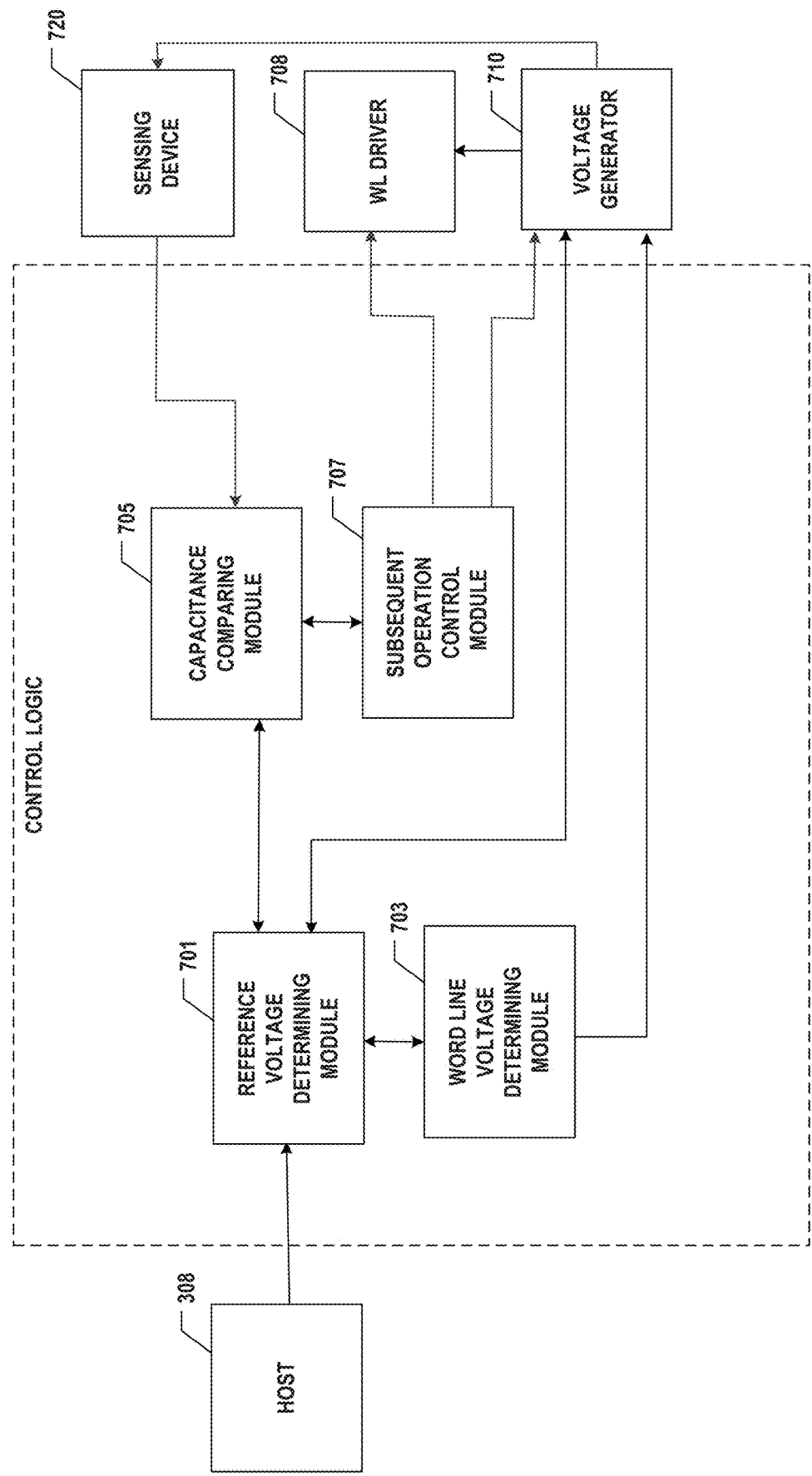
FIG. 7B illustrates a detailed block diagram of control logic in an exemplary memory device including a memory cell array and peripheral circuits, according to some aspects of the present disclosure.
Figure 8A:
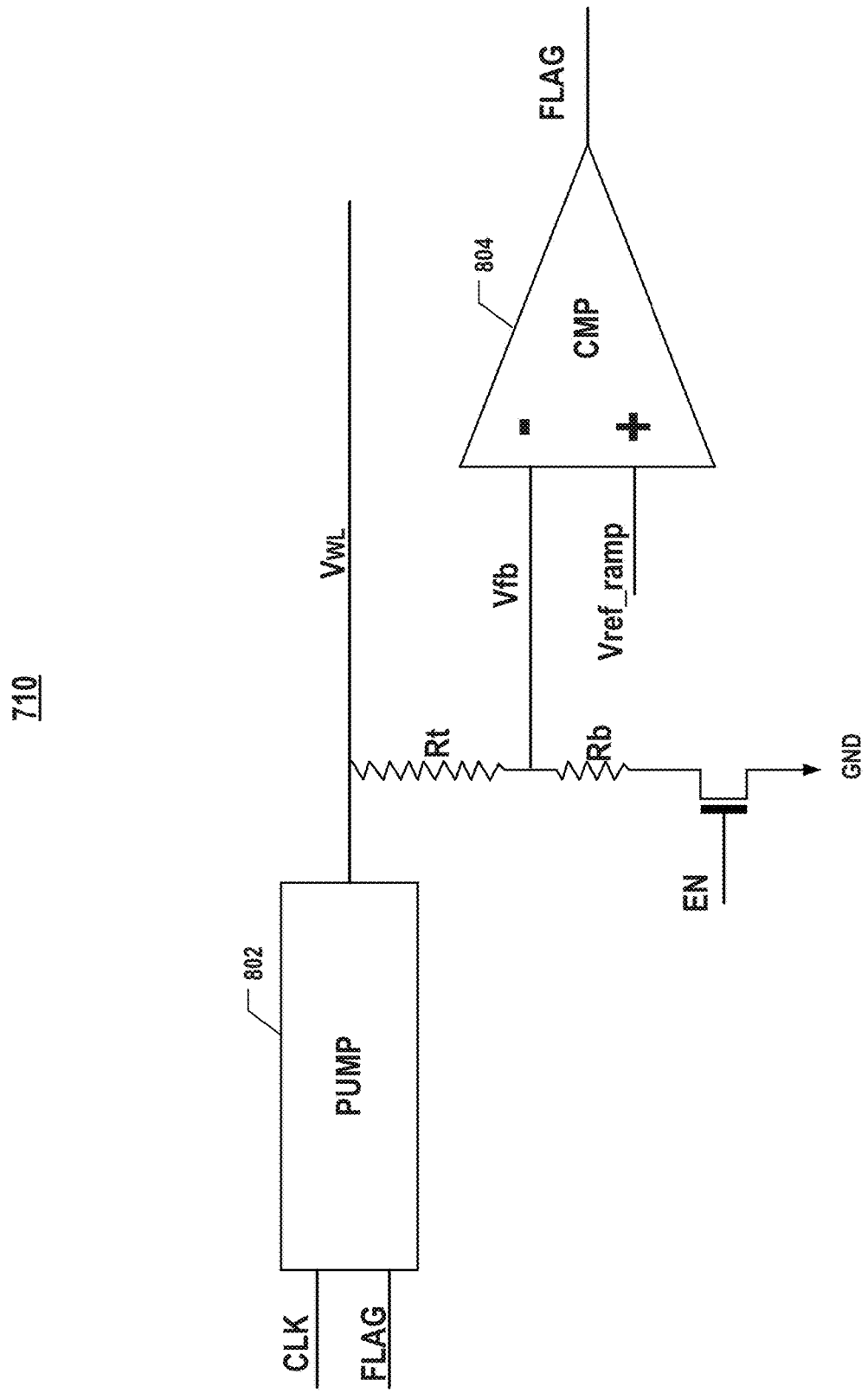
FIG. 8A illustrates an exemplary voltage generator, according to some aspects of the present disclosure.
Figure 8B:
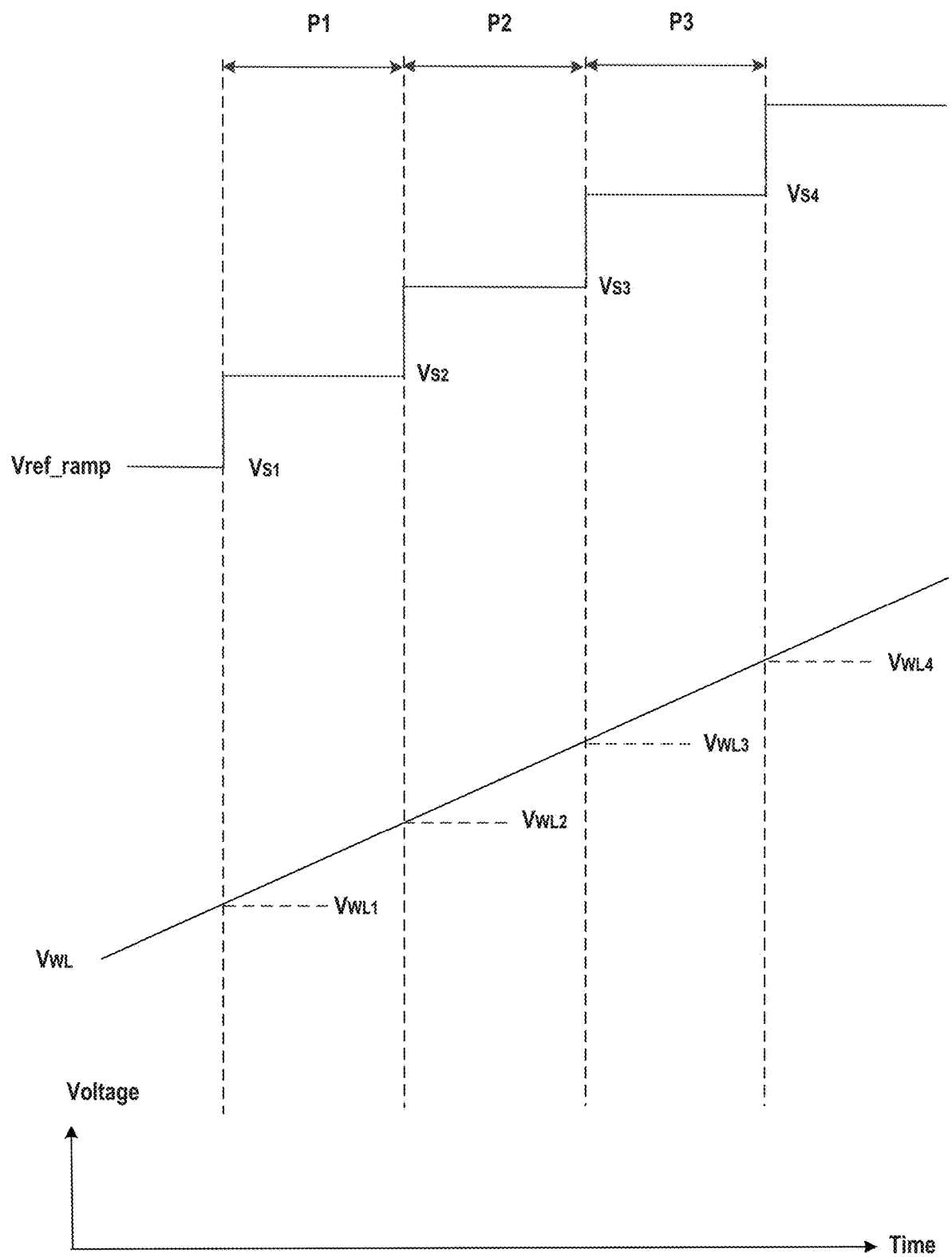
FIG. 8B illustrates an exemplary reference signal and a word line voltage, according to some aspects of the present disclosure.
Figure 8C:
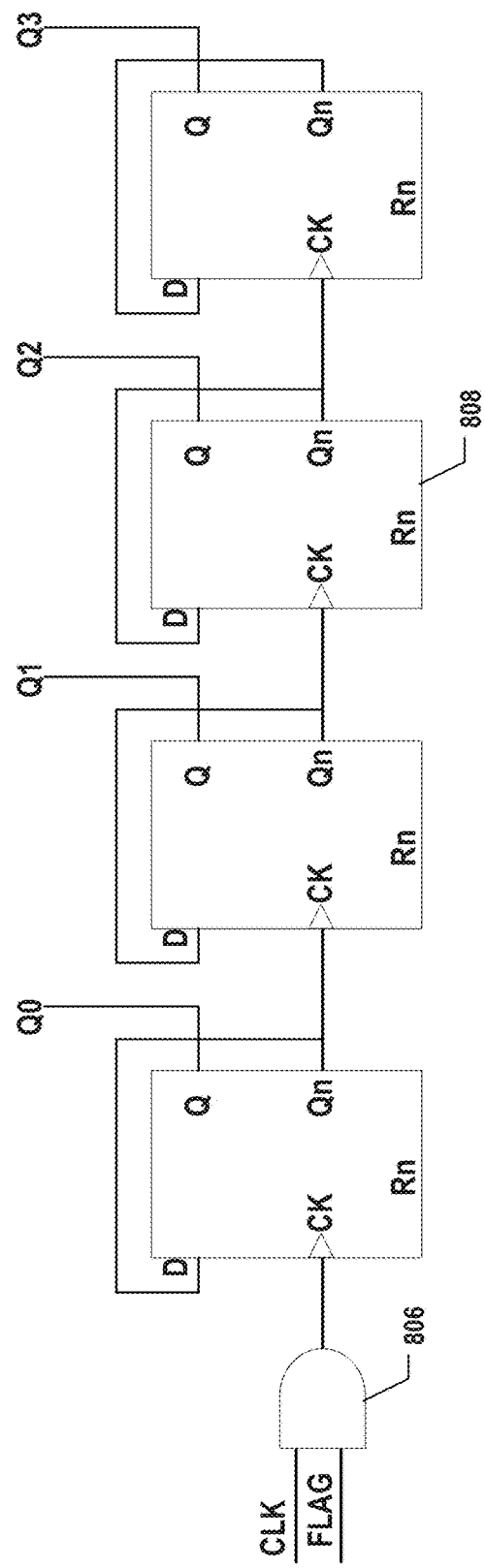
FIG. 8C illustrates an exemplary sensing device, according to some aspects of the present disclosure.
Figure 9A:
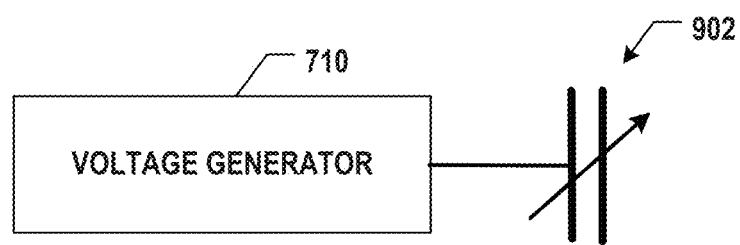
FIG. 9A illustrates an exemplary word line capacitance loading coupled to a voltage generator, according to some aspects of the present disclosure.
Figure 9B:
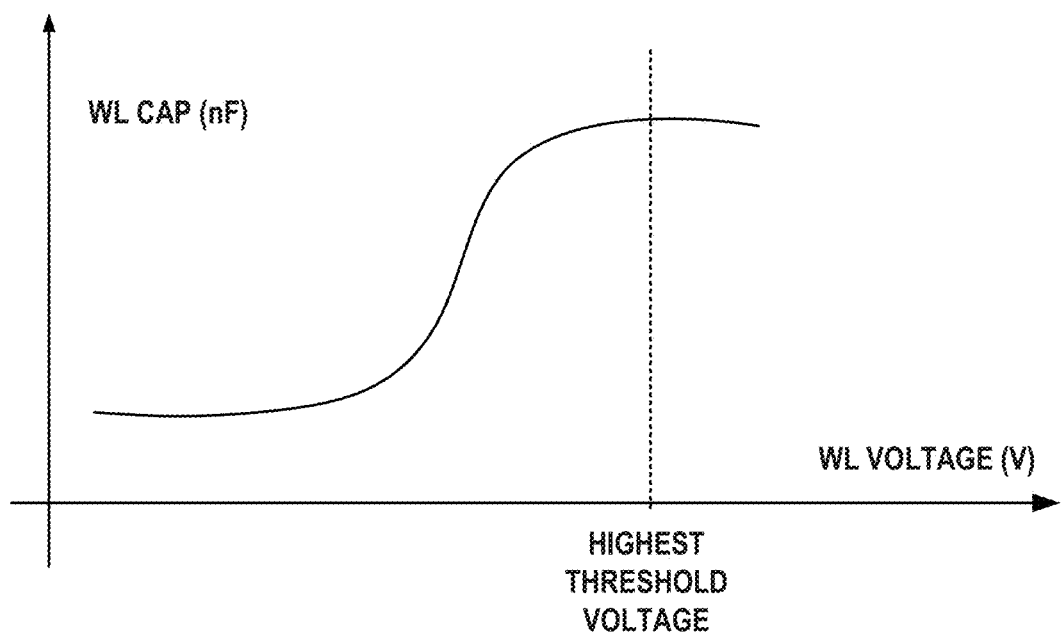
FIG. 9B illustrates a capacitance of the word line capacitance loading as a function of a word line voltage, according to some aspects of the present disclosure.

FIG. 7B illustrates a detailed block diagram of exemplary control logic 712, coupled to host 308, sensing device 720, row decoder/word line driver 708, and voltage generator 710, according to some aspects of the present disclosure. FIG. 8A illustrates an exemplary voltage generator, according to some aspects of the present disclosure. FIG. 8B illustrates a reference signal and a word line voltage, according to some aspects of the present disclosure. FIG. 8C illustrates an exemplary sensing device, according to some aspects of the present disclosure. FIG. 9A illustrates a word line capacitance loading coupled to a voltage generator, according to some aspects of the present disclosure. FIG. 9B illustrates the capacitance of word line capacitance loading as a function of word line voltage, according to some aspects of the present disclosure. For ease of illustration, FIGS. 2, 5, 7B, 8A-8C, 9A, and 9B are described together.

Control logic 712 may include a reference voltage determining module 701, a word line voltage determining module 703, a capacitance comparing module 705, and a subsequent operation control module 707, each including respective software and hardware for performing respective functions. Referring back to FIG. 2, at the beginning of a read operation (e.g., at time T1), a word line voltage, i.e., the voltage applied on all word lines, starts to increase from a low voltage. Referring to FIGS. 5 and 7B, control logic 712 may control the word line voltage, applied on word lines 518 in block 504, to increase. In some implementations, reference voltage determining module 701 and word line voltage determining module 703 are each electrically coupled to voltage generator 710. Reference voltage determining module 701 and word line voltage determining module 703 may be electrically coupled together such that signals/commands can be transmitted in between. One or both of reference voltage determining module 701 and word line voltage determining module 703 may be electrically coupled to host 308 to receive commands, e.g., a read operation command. In some implementations, at time T1, control logic 712 may also control row decoder/word line driver 708 and/or column decoder/bit line driver 706 to start applying/increasing voltage on select gate lines 513 and 515, bit lines 516, source lines 514, etc., referring back to FIG. 2.

Voltage generator 710, coupled to reference voltage determining module 701 and word line voltage determining module 703, may be electrically coupled to row decoder/word line driver 708 and sensing device 720. Reference voltage determining module 701 and word line voltage determining module 703 may control voltage generator 710 to output a word line voltage that is applied on word lines 518 by row decoder/word line driver 708. FIG. 8A illustrates an exemplary voltage generator, which includes a pumping device 802 ("PUMP") that has an output of a word line voltage ($V_{WL}$). Inputs of pumping device 802 include a clock signal ("CLK") and a flag signal ("FLAG"). Pumping device 802 may include any suitable charge pump, such as a direct current (DC)-to-DC converters, that employs capacitors for energetic charge storage to increase or decrease voltage. The output of pumping device 802 is electrically coupled to a comparing circuit, which includes resistors Rt and Rb, a transistor, and a comparator 804. As shown in FIG. 8A, resistor Rt is coupled to the output of pumping device 802, resistor Rb is coupled in series with resistor Rt at a first end of resistor Rb, and the transistor is coupled to resistor Rb at a second end of resistor Rb. In some implementations, resistors Rt and Rb are two separate resistors, each having an unchanged resistance. In some implementations, resistors Rt and Rb are two parts of a variable resistor, and the values of each of Rt and Rb can change. An enable signal ("EN") may be applied on the gate electrode of the transistor to turn on and off the comparing circuit.

Comparator 804 may include any logic circuit that compares the magnitudes of two voltages to determine which one has the greater magnitude. For example, a comparator may include an operational amplifier (Op-Amp) that has a high gain. A first input of comparator 804 is coupled to the first end of resistor Rb such that part of word line voltage $V_{WL}$ is inputted into comparator 804. For ease of description, the first input of comparator 804 is referred to as a word line voltage portion Vfb, which is proportional to the value of word line voltage $V_{WL}$. Word line voltage portion Vfb can vary with word line voltage $V_{WL}$. A second input of comparator 804 is a reference signal Vref_ramp, which is determined by reference voltage determining module 701. An output of comparator 804, the flag signal, may be equal to the difference between the second input and the first input, e.g., (Vref_ramp-Vfb). That is, when the voltage of reference signal Vref_ramp is higher than the voltage of word line voltage portion Vfb, the flag signal is equal to 1; and when the voltage of reference signal Vref_ramp is equal to the voltage of word line voltage portion Vfb, the flag signal is equal to 0.

As shown in FIG. 8A, the flag signal is coupled to the input of pumping device 802 as a feedback signal. When the flag signal is equal to 1, pumping device 802 is on and outputs the word line voltage $V_{WL}$. In some implementations, pumping device 802 keeps increasing the value of word line voltage $V_{WL}$ when pumping. When the flag signal is equal to 0, pumping device 802 is off and stops outputting word line voltage $V_{WL}$. In some implementations, when the flag signal is equal to 0, pumping device 802 stops increasing the value of word line voltage $V_{WL}$. That is, the flag signal can reflect the time pumping device 802 is on before the word line voltage portion Vfb reaches the voltage value of reference signal Vref_ramp.

Upon receiving a read operation command, reference voltage determining module 701 may control voltage generator 710 to generate reference signal Vref_ramp that has a step voltage. At the step voltage, word line voltage determining module 703 controls pumping device 802 to continue to increase the value of word line voltage $V_{WL}$ until word line voltage portion Vfb reaches the step voltage. The flag signal then outputs a "0" and pumping device 802 stops increasing/outputting word line voltage $V_{WL}$. Reference voltage determining module 701 may then control voltage generator 710 to generate a higher step voltage. Because word line voltage portion Vfb is lower than the higher step voltage, the comparing circuit generates a flag signal equal to 1, and pumping device 802 can start to increase word line voltage $V_{WL}$ until word line voltage portion Vfb reaches the higher step voltage.

FIG. 8B illustrates an exemplary reference signal Vref_ramp and an exemplary word line voltage $V_{WL}$ in three consecutive periods P1, P2, and P3, according to some implementations of the present disclosure. It should be noted that the values of the voltages and periods are merely for illustration and are not to scale. Also, word line voltage $V_{WL}$ may increase in any suitable curves/lines versus time and FIG. 8B merely shows the trend of word line voltage $V_{WL}$. For ease of illustration, word line voltage $V_{WL}$ is shown to increase linearly as a function of time.

Controlled by reference voltage determining module 701, voltage generator 710 may generate a plurality of step voltages as reference signal Vref_ramp, each step voltage represents an unchanged voltage over a respective period of time. For example, as shown in FIG. 8B, reference signal Vref_ramp may increase from $V_{S1}$ to $V_{S2}$ at the beginning of period P1, from $V_{S2}$ to $V_{S3}$ at the beginning of period P2, and from $V_{S3}$ to $V_{S4}$ at the beginning of period P3. Each step voltage is higher than the previous step voltage, e.g., $V_{S1}<V_{S2}<V_{S3}<V_{S4}$. Periods P1, P2, and P3 may have the same length or have different lengths in time. The length of each period, e.g., P1, P2, and P3, may be determined by the time pumping device 802 is on at the respective step voltage.

Word line voltage $V_{WL}$ may increase from $V_{WL1}$ to $V_{WL2}$ at the end of period P1, from $V_{WL2}$ to $V_{WL3}$ at the end of period P2, and $V_{WL3}$ to $V_{WL4}$ at the end of period P3.

As described before, prior to the beginning of period P1, word line voltage $V_{WL}$ is equal to $V_{WL1}$, word line voltage portion Vfb is equal to step voltage $V_{S1}$, flag signal is equal to 0, and pumping device 802 stops increasing word line voltage $V_{WL}$. Reference voltage determining module 701 may sense the operation of pumping device 802, and control voltage generator 710 to generate step voltage $V_{S2}$, which is higher than step voltage $V_{S1}$. That is, at the beginning of period P1, step voltage $V_{S2}$ is greater than word line voltage portion Vfb, and comparator 804 outputs flag signal equal to 1. Pumping device 802 may start pumping and increasing word line voltage $V_{WL}$ during period P1. Word line voltage portion Vfb keeps increasing as word line voltage $V_{WL}$ until reaching step voltage $V_{S2}$, and word line voltage $V_{WL}$ reaches $V_{WL2}$. Comparator 804 may then output flag signal equal to 0, and pumping device 802 stops increasing or outputting word line voltage $V_{WL}$. Period P1 then ends. Reference voltage determining module 701 may sense the operation of pumping device 802, and control voltage generator 710 to generate step voltage $V_{S3}$, as the second input of the comparing circuit. Pumping device 802 may increase word line voltage $V_{WL}$ until word line voltage portion Vfb reaches $V_{S3}$ and word line voltage $V_{WL}$ reaches $V_{WL3}$ at the end of period P2. Reference voltage determining module 701 may sense the operation of pumping device 802 and control voltage generator 710 to generate step voltage $V_{S4}$, as the second input of the comparing circuit. Similarly, pumping device 802 may increase word line voltage $V_{WL}$ until word line voltage portion Vfb reaches $V_{S4}$ and word line voltage $V_{WL}$ reaches $V_{WL4}$ at the end of period P3. For each period, reference voltage determining module 701 and word line voltage determining module 703 may control voltage generator 710 to repeat the above operation until $V_{WL}$ reaches the highest threshold voltage of memory cells 506.

Referring to FIG. 9A, when word line voltage $V_{WL}$ keeps increasing, word lines 518 and memory cells 506 may be equivalent to a word line capacitance loading 902 that has a variable capacitance. The capacitance of word line capacitance loading 902 may keep increasing when word line voltage $V_{WL}$ keeps increasing. This can be caused by the increasing number of memory cells of which the threshold voltages are low the value of word line voltage $V_{WL}$ and the respective portions of the channel structure 612 are coupled with word lines 518. When reference signal Vref_ramp reaches a higher step voltage in each period (e.g., P1, P2, and P3), word line voltage $V_{WL}$ may keep increasing and charging the variable capacitance (e.g., flag signal being equal to 1) until pumping device 802 stops increasing word line voltage $V_{WL}$ (e.g., flag signal being equal to 0). Thus, at each step voltage of reference signal Vref_ramp, the length of time that word line capacitance loading 902 is charged is equivalent to the time that flag signal is equal to 1 before turning to 0. That is, the time that the flag signal is 1 at each step voltage of reference signal Vref_ramp can reflect the capacitance change of word line capacitance loading 902, i.e., the capacitance charged to word line capacitance loading 902. FIG. 9B illustrates a capacitance of word line capacitance loading 902 ("WL CAP(nF)") as a function of word line voltage ("WL VOLTAGE(V)"). As shown in FIG. 9B, the capacitance may keep increasing until word line voltage $V_{WL}$ reaches the highest threshold voltage of memory cells 506. The capacitance may then stop increasing or start decreasing. In some implementations, the function shown in FIG. 9B may be obtained prior to the detection of the highest threshold voltage, e.g., as a reference for comparison. For example, the function may be measured and saved in the memory device (e.g., 304) and/or the memory controller (e.g., 306).

Referring back to FIG. 7B, sensing device 720 may be electrically coupled to voltage generator 710 to obtain capacitance change of word line capacitance loading 902 based on the flag signal. Sensing device 720 may generate a value that reflects the time flag signal is equal to 1 at each step voltage of reference signal Vref_ramp. For example, during each period of a respective step voltage, e.g., P1, P2, and P3, the flag signal is equal to 1 until word line voltage portion Vfb reaches the respective step voltage at the end of the respective period. The flag signal is equal to 0 between two adjacent periods, e.g., between period P1 and P2, and P2 and P3, etc. The output of sensing device 720 may include values that represent the time flag signal equal to 1 at each step voltage (e.g., $V_{S2}$, $V_{S3}$, and $V_{S4}$). In some implementations, the output of sensing device 720 may include values each representing the length of a respective period, e.g., P1, P2, and P3, and indicative of the capacitance charged into word line capacitance loading 902 during the respective period.

FIG. 8C illustrates an exemplary sensing device 720, according to some implementations of the present disclosure. Sensing device 720 may include a counter having a first input of a clock signal ("CLK") and a second input of the flag signal ("FLAG"). The output of sensing device 720 may include a plurality of binary digits, e.g., Q0Q1Q2Q3. When the flag signal is equal to 1, the counter keeps counting on the clock signal, and the output keeps increasing until the flag signal turns 0. The counter stops counting when the flag signal is 0, and the output reflects the time the flag signal is equal to 1. In some implementations, the counter stops counting between two adjacent periods, e.g., between P1 and P2, and P2 and P3, and outputs the value corresponding to the most recent period. In some implementations, a reset signal (not shown) is coupled to the counter to reset the output to 0 after each period. Thus, the output of the counter includes values each reflecting the time the flag signal is equal to 1 before turning 0. In some implementations, the output of the counter includes values each reflecting the time of a respective period, e.g., P1, P2, and P3. In some implementations, the counter includes an AND gate 806 coupled to a plurality of flip flops 808 (e.g., latches). The inputs are coupled to the counter through AND gate 806, and each of the flip flops 808 outputs a digit. In various implementations, the number of flip flops 808 can vary. In some implementations, sensing device 720 may output a plurality of values C1, C2, C3, . . . , each associated with the time the flag signal is equal to 1 in a respective period, e.g., the length of a respective period. As described above, the values C1, C2, C3, . . . may each be associated with the capacitance change of, i.e., the capacitance charged to, word line capacitance loading 902 at the respective step voltage.

Referring back to FIG. 7A, sensing device 720 may be electrically coupled to capacitance comparing module 705 of control logic 712. Sensing device 720 may transmit the outputs, e.g., values C1, C2, C3, . . . to capacitance comparing module 705 after each respective period. Capacitance comparing module 705 may receive the outputs of sensing device 720 and compare the difference between two adjacent values, e.g., the value of ($C_{n+1}-C_n$), n being 1, 2, 3, etc. Based on the results of the comparisons, capacitance comparing module 705 may determine the time when the maximum capacitance of word line capacitance loading 902 is reached and the value of the highest threshold voltage of memory cells 506. For example, when the capacitance of word line capacitance loading 902 approaches the maximum value, ($C_{n+1}-C_n$) reaches its maximum value. Capacitance comparing module 705 may then determine when ($C_{n+1}-C_n$) reaches its maximum value, word line voltage $V_{WL}$ has reached the highest threshold voltage of memory cells 506, and the step voltage corresponding to $C_{n+1}$ is the highest threshold voltage. In an example, value C1 may represent the output of sensing device 720 for period P1, value C2 may represent the output of sensing device 720 for period P2, and value C3 may represent the output of sensing device 720 for period P3. Capacitance comparing module 705 may determine the value of (C2−C1) after receiving value C2, and the value of (C3−C2) after receiving C3. If (C3−C2) is equal to or less than (C2−C1), capacitance comparing module 705 may determine word line voltage $V_{WL}$ reaches the highest threshold voltage of memory cells 506 by the end of period P2, and the value of the highest threshold voltage is equal to or sufficiently close to $V_{WL3}$.

Capacitance comparing module 705 may also be electrically coupled to reference voltage determining module 701. In some implementations, when word line voltage $V_{WL}$ reaches the highest threshold voltage of memory cells 506, capacitance comparing module 705 notifies reference voltage determining module 701, and reference voltage determining module 701 controls voltage generator 710 to stop increasing the value of the step voltage in reference signal Vref_ramp. In some implementations, when receiving a command for a read operation, reference voltage determining module 701 notifies capacitance comparing module 705 such that capacitance comparing module 705 can initialize to perform the comparisons.

Subsequent operation control module 707 may be electrically coupled to capacitance comparing module 705, which is electrically coupled to row decoder/word line driver 708 and voltage generator 710. In some implementations, when word line voltage $V_{WL}$ reaches the highest threshold voltage of memory cells 506, capacitance comparing module 705 notifies subsequent operation control module 707, which can start other operations based on the time the highest threshold value is reached (e.g., at time T2, referring back to FIG. 2) and/or the value of the highest threshold voltage. For example, when word line voltage $V_{WL}$ reaches the highest threshold voltage of memory cells 506, subsequent operation control module 707 may control row decoder/word line driver 708 to apply a turn-off voltage (e.g., a low voltage) on unselected DSGs, unselected SSGs, and the selected word line, referring back to FIG. 2. Subsequent operation control module 707 may also determine the read reference voltages and Vpass based on the value of the highest threshold voltage of memory cells 506. For example, subsequent operation control module 707 may compare the detected highest threshold voltage with the highest threshold voltage stored in memory device 304 prior to the detection. In some implementations, if the highest threshold voltage has shifted to a lower voltage, subsequent operation control module 707 may determine one or more read reference voltages to each have a lower voltage value. Subsequent operation control module 707 may determine the value of Vpass by referring to a look-up table for an overdrive value (e.g., ΔV in FIG. 2) corresponding to the value of the highest threshold value, or perform a real-time calculation to determine the overdrive value. In some implementations, subsequent operation control module 707 controls voltage generator 710 to generate the determined read reference voltage and Vpass, and controls row decoder/word line driver 708 to apply the respective voltages on respective word lines.

It should be noted that, in various implementations, other suitable quantities of voltage generator 710 may also be monitored, additionally or optionally, to detect the highest threshold voltage of memory cells 506 at a desirable time, such as in a real-time manner or at a desired time. For example, sensing device 720 may be configured to output values that reflect the change in electric current outputted by voltage generator 710. In some implementations, the electric current of voltage generator 710 reaches the highest in a period of time when word line voltage $V_{WL}$ reaches or approaches the highest threshold voltage.

Figure 10A:
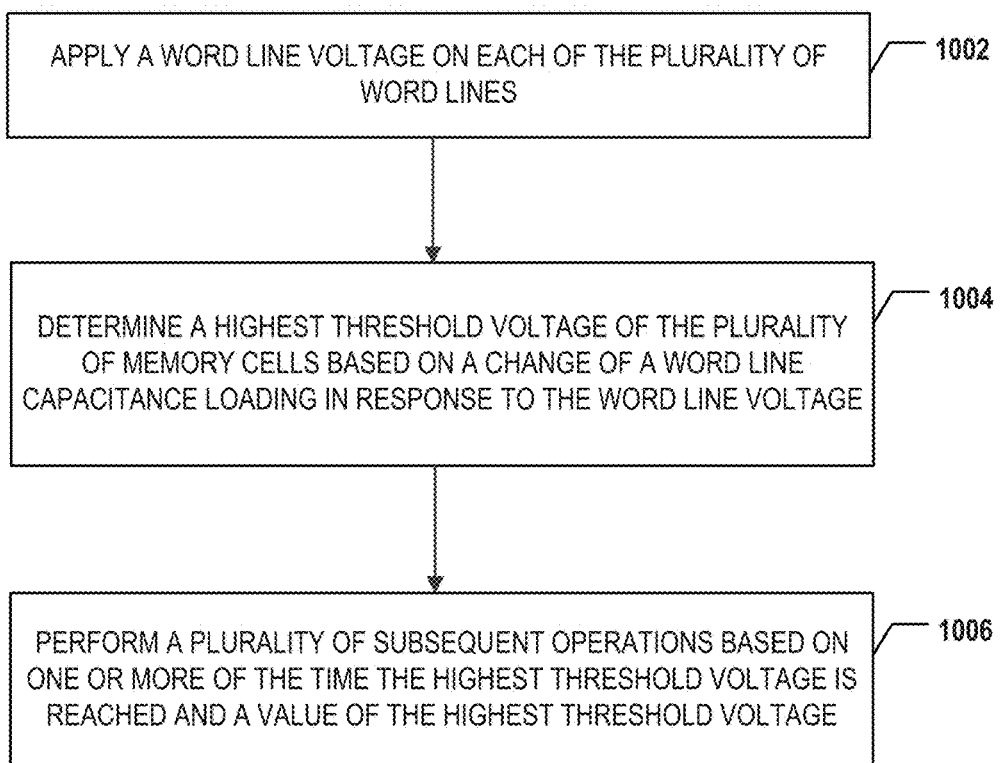
FIG. 10A illustrates a flowchart of a method for operating a memory device, according to some aspects of the present disclosure.

FIG. 10A illustrates a flowchart of a method 1000 for operating a memory device, according to some aspects of the present disclosure. The memory device may be any suitable memory device disclosed herein, such memory device 304. Method 1000 may be implemented by peripheral circuit 502, such as control logic 712, voltage generator 710, row decoder/word line driver 708, and sensing device 720. It is understood that the operations shown in method 1000 may not be exhaustive and that other operations can be performed as well before, after, or between any of the illustrated operations. Further, some of the operations may be performed simultaneously, or in a different order than shown in FIG. 10A.

Referring to FIG. 10A, method 1000 starts at operation 1002, in which a word line voltage is applied on each of the plurality of word lines. At the beginning of the read operation, the control logic controls the voltage generator to generate a word line voltage, and controls the row decoder/word line driver to apply the word line voltage on all word lines. The control logic may control the voltage generator to increase the word line voltage by following a reference signal that has a plurality of step voltages.

Method 1000 proceeds to operation 1004, in which the highest threshold voltage of the plurality of memory cells coupled to the word lines is determined based on a change of a word line capacitance loading in response to the word line voltage. From the sensing device, the control logic may obtain the capacitance change in the word line capacitance loading, formed by the memory cells and the word lines, as a response to the increase of word line voltage. Based on the capacitance change, the control logic may determine the time that the maximum capacitance of the word line capacitance loading is reached. The control logic may accordingly determine the word line voltage at the time the maximum capacitance is reached to be the highest threshold voltage of the memory cells. A detailed description of operations 1002 and 1004 is illustrated in FIG. 10B.

Method 1000 proceeds to operation 1006, in which a plurality of subsequent operations are performed based on one or more of the time that the word line voltage reaches the highest threshold voltage and a value of the highest threshold voltage. Control logic may start performing other operations, from the time the highest threshold voltage is reached. For example, at the time the highest threshold voltage is reached, the control logic may control the voltage generator to generator a low voltage and control the row decoder/word line driver to apply the low voltage on the unselected select gates. The control logic may also calculate Vpass to be applied on unselected word lines based on the value and read reference voltages to be applied on the selected word line. The control logic may then control the voltage generator to continue to increase the word line voltage on the unselected word lines until Vpass is reached.

Figure 10B:
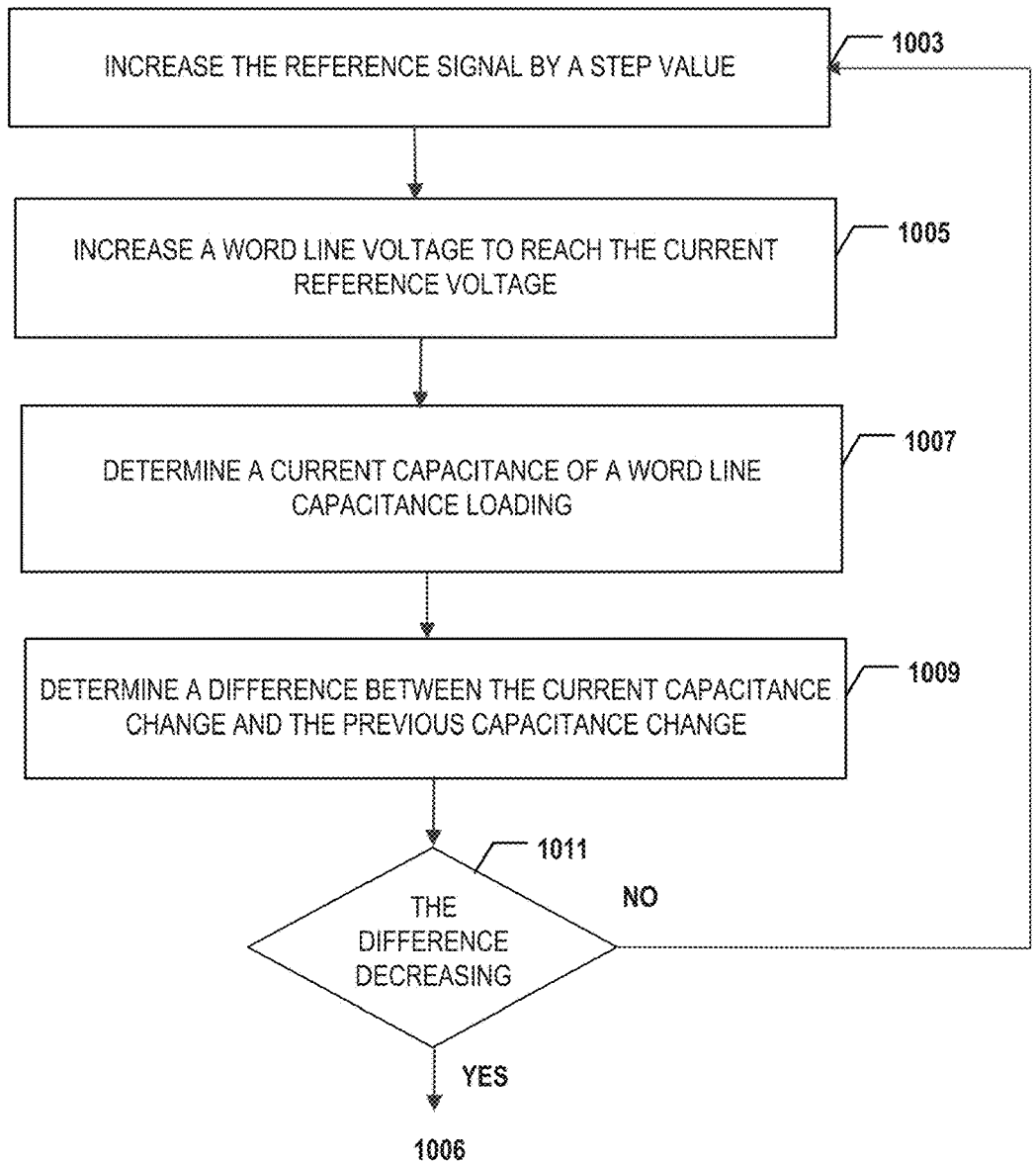
FIG. 10B illustrates a flowchart of detailed operations performed by the memory device, according to some aspects of the present disclosure.

FIG. 10B illustrates a flowchart of a method 1001 for operating a memory device, according to some aspects of the present disclosure. Method 1001 includes detailed operations of operation 1004 in FIGS. 10A and 10B and can be implemented by peripheral circuit 502, such as control logic 712, voltage generator 710, row decoder/word line driver 708, and sensing device 720. It is understood that the operations shown in method 1001 may not be exhaustive and that other operations can be performed as well before, after, or between any of the illustrated operations. Further, some of the operations may be performed simultaneously, or in a different order than shown in FIG. 10B. For ease of illustration, FIG. 10B illustrates operations in period Pn, and the word line voltage increases from $V_n$ to $V_{n+1}$.

Referring to FIG. 10B, method 1001 starts at operation 1003, in which the reference signal is increased by a step value at the beginning of period Pn. The word line voltage is equal to $V_n$ at the beginning of period Pn. The control logic may determine a step value and increase the voltage of the reference signal by the step value. The reference signal may be an input of a comparing circuit of the voltage generator, and is compared with a word line voltage portion. The word line voltage portion is a portion of the word line voltage, which is outputted by a pumping device of the voltage generator. When the word line voltage portion is lower than the reference signal, the comparing circuit outputs a flag signal of 1, and when the word line voltage portion is equal to the reference signal, the comparing circuit outputs a flag signal of 0. The flag signal is also an input of the pumping device.

Method 1001 proceeds to operation 1005, in which the word line voltage is increased to reach the current reference voltage. The control logic may control the pumping device to keep increasing the value of word line voltage when the flag signal is 1. When the word line voltage portion is equal to the current reference signal (e.g., the current step voltage), the flag signal is equal to 0, and the pumping device stops increasing the value of word line voltage. The word line voltage increases from $V_n$ to $V_{n+1}$ at the end of period Pn.

Method 1001 proceeds to operation 1007, in which a current capacitance of the word line capacitance loading is determined after the word line voltage reaches the current reference signal. The sensing device may output a value $C_{n+1}$ that is indicative of the time that the flag signal is 1. The value is associated with the capacitance change, or i.e., the capacitance charged to, the word line capacitance loading during period Pn.

Method 1001 proceeds to operation 1009, in which a difference between the current capacitance change and the previous capacitance change is determined. The control logic may obtain the value and obtain the difference between value $C_{n+1}$ and value $C_n$, which is generated by the sensing device for period Pn−1 immediately before period Pn. For example, the control logic may determine the value of $(C_{n+1}-C_n)$.

Method 1001 proceeds to operation 1011, in which it is determined whether the difference obtained in operation 1009 decreases compared to a previous difference. The control logic may compare the values of $(C_{n+1}-C_n)$ and $(C_n-C_{n-1})$, and determine whether $(C_{n+1}-C_n)$ is less than or equal to $(C_n-C_{n-1})$, where $C_{n-1}$ is generated by the sensing device for period Pn−2 and is obtained by the control logic at the end of period Pn−2. If $(C_{n+1}-C_n)$ is less than or equal to $(C_n-C_{n-1})$, the control logic determines the word line capacitance loading has reached the maximum capacitance. The control signal may then determine the time that the maximum capacitance of the word line capacitance loading is reached, and the word line voltage at the time the maximum capacitance is reached to be the highest threshold voltage of the memory cells. Method 1001 proceeds to operation 1006. If ($C_{n+1}-C_n$) is greater than ($C_n-C_{n-1}$), the control logic determines the word line capacitance loading has not reached the maximum capacitance, and method 1001 proceeds to operation 1003.

Implementations of the present disclosure provides a memory device. The memory device includes an array of memory cells in a plurality of memory strings and arranged in a plurality of rows of memory cells. The memory device also includes a plurality of word lines respectively coupled to the plurality of rows of memory cells, and a peripheral circuit coupled to the plurality of word lines and configured to perform a read operation on a selected row of memory cells of the plurality of rows of memory cells. The selected row of memory cells is coupled to a selected word line, wherein the peripheral circuit is configured to apply a word line voltage on each of the plurality of word lines and determine a highest threshold voltage of the plurality of rows of memory cells based on a change of a word line capacitance loading in response to the word line voltage.

In some implementations, the word line capacitance loading includes a variable capacitance, and determining the highest threshold voltage of the plurality of rows of memory cells includes determining a maximum capacitance of the variable capacitance, and determining the highest threshold voltage based on the maximum capacitance.

In some implementations, the peripheral circuit includes a control logic configured to perform a least one of, determining a time at which the highest threshold voltage is reached, determining a pass voltage applied on an unselected word line of the plurality of word lines in the read operation based on the highest threshold voltage, or determining a read reference voltage applied on the selected word line based on the highest threshold voltage.

In some implementations, the peripheral circuit further includes a driver configured to, based on operations of the control logic, perform a least one of, applying a turn-off voltage on a SG transistor coupled to an unselected memory string of the plurality of memory strings at the time the highest threshold voltage is reached, applying the pass voltage on the unselected word line of the plurality of word lines in the read operation, or applying the read reference voltage on the selected word line.

In some implementations, the peripheral circuit further includes a voltage generator configured to output the word line voltage, a control logic configured to control the voltage generator, and a driver configured to apply the word line voltage on the plurality of rows of memory cells. The control logic controls the voltage generator to increase the word line voltage from a first voltage value to a second voltage value, and from the second voltage value to a third voltage value. The driver applies the word line voltage on the plurality of word lines.

In some implementations, the control logic is further configured to, obtain a first value associated with a first capacitance charged to the word line capacitance loading between the first voltage value and the second voltage value, and a second value associated with a second capacitance charged to the word line capacitance loading between the second voltage value and the third voltage value. The control logic is also configured to determine a difference between the first value and the second value. The control logic is further configured to, in response to the difference reaching a maximum value, determine a capacitance of the word line capacitance loading to be the maximum capacitance of the word line capacitance loading.

In some implementations, the control logic is further configured to determine the third voltage value to be the highest threshold voltage of the plurality of rows of memory cells.

In some implementations, the peripheral circuit further includes a sensing device coupled to the voltage generator and the control logic. The sensing device is configured to generate the first value associated with the first capacitance and generate the second value associated with the second capacitance.

In some implementations, the voltage generator further includes a comparing circuit having an output of a flag signal, the flag signal being coupled to an input of the voltage generator. In response to the flag signal being equal to 1, the voltage generator continues to increase the word line voltage. In response to the flag signal being equal to 0, the voltage generator stops increasing the word line voltage.

In some implementations, the flag signal is equal to 1 in a first time period and a second time period, respectively. In some implementations, the flag signal is equal to 0 between the first time period and the second time period.

In some implementations, the sensing device includes a counter that counts a time period in response to the flag being 1 and generates a value corresponding to the time period, such that the first time period corresponds to the first value and the second time period corresponds to the second value.

In some implementations, the sensing device outputs the first value at an end of the first time period and outputs the second value at an end of the second time period.

In some implementations, the sensing device includes an input and a plurality of flip flops. The input includes the flag signal. Each of the flip flops generates a digit of an output of the sensing device.

In some implementations, the comparing circuit includes a first input of a voltage portion proportional to the word line voltage and a second input of a reference signal coupled to the control logic, the flag signal being a difference between the voltage portion and the reference signal. The control logic is configured to apply a first step voltage on the second input of the comparator. The first step voltage is equal to the second voltage. The control logic is also configured to obtain the first value from the sensing device. The control logic is further configured to, in response to the flag signal turning from 1 to 0, apply a second step voltage on the second input of the comparator, the second step voltage being equal to the third voltage and greater than the first step voltage. The control logic is further configured to obtain the second value from the sensing device.

In some implementations, the plurality of memory cells includes at least one of a plurality of TLCs or a plurality of QLCs. In some implementations, the highest threshold voltage of the plurality of rows of memory cells includes at least one of a highest threshold voltage in the TLCs or one of a highest threshold voltage in the QLCs.

In some implementations, the plurality of memory cells are in a 3D NAND memory device.

Implementations of the present disclosure provide a system. The system includes a memory device configured to store data. The memory device includes an array of memory cells in a plurality of memory strings and arranged in a plurality of rows of memory cells, a plurality of word lines respectively coupled to the plurality of rows of memory cells, and a peripheral circuit coupled to the plurality of word lines and configured to perform a read operation on a selected row of memory cells of the plurality of rows of memory cells. The selected row of memory cells is coupled to a selected word line. The peripheral circuit is configured to, apply a word line voltage on each of the plurality of word lines, and determine a highest threshold voltage of the plurality of rows of memory cells based on a change of a word line capacitance loading in response to the word line voltage. The system also includes a memory controller coupled to the memory device and configured to control the memory device.

In some implementations, the word line capacitance loading includes a variable capacitance. In some implementations, determining the highest threshold voltage of the plurality of rows of memory cells includes determining a maximum capacitance of the variable capacitance, and determining the highest threshold voltage based on the maximum capacitance.

In some implementations, the peripheral circuit includes a control logic configured to perform a least one of, determining a time at which the highest threshold voltage is reached, determining a Vpass voltage applied on an unselected word line of the plurality of word lines in the read operation based on the highest threshold voltage, or determining a read reference voltage applied on the selected word line based on the highest threshold voltage.

In some implementations, the peripheral circuit further includes a driver configured to, based on operations of the control logic, perform a least one of, applying a turn-off voltage on a SG transistor coupled to an unselected memory string of the plurality of memory strings at the time the highest threshold voltage is reached; applying the Vpass voltage on the unselected word line of the plurality of word lines in the read operation; or applying the read reference voltage on the selected word line.

In some implementations, the peripheral circuit further includes a voltage generator configured to output the word line voltage, a control logic configured to control the voltage generator, and a driver configured to apply the word line voltage on the plurality of rows of memory cells. The control logic controls the voltage generator to increase the word line voltage from a first voltage value to a second voltage value, and from the second voltage value to a third voltage value. The driver applies the word line voltage on the plurality of word lines.

In some implementations, the control logic is further configured to, obtain a first value associated with a first capacitance charged to the word line capacitance loading between the first voltage value and the second voltage value, and a second value associated with a second capacitance charged to the word line capacitance loading between the second voltage value and the third voltage value. In some implementations, the control logic is also configured to determine a difference between the first value and the second value. In some implementations, the control logic is further configured to, in response to the difference reaching a maximum value, determine a capacitance of the word line capacitance loading to be the maximum capacitance of the word line capacitance loading.

In some implementations, the control logic is further configured to determine the third voltage value to be the highest threshold voltage of the plurality of rows of memory cells.

In some implementations, the peripheral circuit further includes a sensing device coupled to the voltage generator and the control logic. The sensing device is configured to generate the first value associated with the first capacitance, and generate the second value associated with the second capacitance.

In some implementations, the voltage generator further includes a comparing circuit having an output of a flag signal, the flag signal being coupled to an input of the voltage generator. In response to the flag signal being equal to 1, the voltage generator continues to increase the word line voltage. In response to the flag signal being equal to 0, the voltage generator stops increasing the word line voltage.

In some implementations, the flag signal is equal to 1 in a first time period and the a time period, respectively. In some implementations, the flag signal is equal to 0 between the first time period and the second time period.

In some implementations, the sensing device includes a counter that counts a time period in response to the flag being 1 and generates a value corresponding to the time period, such that the first time period corresponds to the first value and the second time period corresponds to the second value.

In some implementations, the sensing device outputs the first value at an end of the first time period and outputs the second value at an end of the second time period.

In some implementations, the sensing device includes an input and a plurality of flip flops. The input includes the flag signal, each of the flip flops generating a digit of an output of the sensing device.

In some implementations, the comparing circuit includes a first input of a voltage portion proportional to the word line voltage and a second input of a reference signal coupled to the control logic. The flag signal is a difference between the voltage portion and the reference signal. The control logic is configured to, apply a first step voltage on the second input of the comparator. The first step voltage is equal to the second voltage. The control logic is also configured to obtain the first value from the sensing device. The control logic is further configured to, in response to the flag signal turning from 1 to 0, apply a second step voltage on the second input of the comparator, the second step voltage being equal to the third voltage and greater than the first step voltage. In some implementations, the control logic is further configured to obtain the second value from the sensing device.

In some implementations, the plurality of memory cells includes at least one of a plurality of TLCs or a plurality of QLCs. In some implementations, the highest threshold voltage of the plurality of rows of memory cells includes at least one of a highest threshold voltage in the TLCs or one of a highest threshold voltage in the QLCs.

In some implementations, the memory device is a 3D NAND memory device.

Implementations of the present disclosure further provide a method for operating a memory device. The memory device includes an array of memory cells in a plurality of memory strings and arranged in a plurality of rows of memory cells; and a plurality of word lines respectively coupled to the plurality of rows of memory cells. The method includes performing a read operation on a selected row of memory cells of the plurality of rows of memory cells. The selected row of memory cells is coupled to a selected word line. The performing the read operation includes, applying a word line voltage on each of the plurality of word lines, and determining a highest threshold voltage of the plurality of rows of memory cells based on a change of a word line capacitance loading in response to the word line voltage.

In some implementations, the word line capacitance loading includes a variable capacitance. In some implementations, determining the highest threshold voltage of the plurality of rows of memory cells includes, determining a maximum capacitance of the variable capacitance, and determining the highest threshold voltage based on the maximum capacitance.

In some implementations, the method further includes, determining a time at which the highest threshold voltage is reached, determining a Vpass voltage applied on an unselected word line of the plurality of word lines in the read operation based on the highest threshold voltage, or determining a read reference voltage applied on the selected word line based on the highest threshold voltage.

In some implementations, the method further includes performing a least one of, applying a turn-off voltage on a SG transistor coupled to an unselected memory string of the plurality of memory strings at the time the highest threshold voltage is reached, applying the pass voltage on the unselected word line of the plurality of word lines in the read operation, or applying the read reference voltage on the selected word line.

In some implementations, the method further includes increasing the word line voltage from a first voltage value to a second voltage value, and from the second voltage value to a third voltage value. The method also includes applying the word line voltage on the plurality of word lines.

In some implementations, the method further includes, obtaining a first value associated with a first capacitance charged to the word line capacitance loading between the first voltage value and the second voltage value, and a second value associated with a second capacitance charged to the word line capacitance loading between the second voltage value and the third voltage value. The method may also include determining a difference between the first value and the second value. The method may further include, in response to the difference reaching a maximum value, determining a capacitance of the word line capacitance loading to be the maximum capacitance of the word line capacitance loading.

In some implementations, the method further includes determining the third voltage value to be the highest threshold voltage of the plurality of rows of memory cells.

In some implementations, the method further includes generating the first value associated with the first capacitance, and generating the second value associated with the second capacitance.

In some implementations, the method further includes generating a flag signal. The flag signal is coupled to an input of the voltage generator. In some implementations, the method also includes, in response to a flag signal being equal to 1, increasing the word line voltage; and in response to the flag signal being equal to 0, ceasing to increase the word line voltage.

In some implementations, the flag signal is equal to 1 in a first time period and a second time period, respectively. In some implementations, the flag signal is equal to 0 between the first time period and the second time period.

In some implementations, the method further includes obtaining a voltage portion proportional to the word line voltage and increasing the word line voltage in a first time period by comparing the voltage portion to a first step voltage. First step voltage is equal to the second voltage. In some implementations, the method further includes counting a length of the first time period to obtain the first value. In some implementations, the method further includes, in response to the flag signal turning from 1 to 0, increasing the word line voltage in a second time period by comparing the voltage portion to a second step voltage. The second step voltage is equal to the third voltage and greater than the first step voltage. In some implementations, the method further includes counting a length of the second time period to obtain the second value.

In some implementations, the plurality of memory cells includes at least one of a plurality of TLCs or a plurality of QLCs. In some implementations, the highest threshold voltage of the plurality of rows of memory cells includes at least one of a highest threshold voltage in the TLCs or one of a highest threshold voltage in the QLCs.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A circuit, comprising:
    a voltage generator comprising a first output and a second output, the first output being configured to output a word line voltage, and the second output being configured to output a flag signal indicates a relationship between the word line voltage and a reference signal; and
    a sensing device comprising a first input and a third output, wherein the first input is coupled to the second output of the voltage generator, and the third output of the sensing device is configured to output a value corresponding to capacitance change of word line capacitance loading based on the flag signal.

2. The circuit of claim 1, wherein the voltage generator is configured to increase the word line voltage from a first voltage value to a second voltage value, and from the second voltage value to a third voltage value.

3. The circuit of claim 2, wherein the sensing device is configured to generate a first value associated with a first capacitance charged to the word line capacitance loading between the first voltage value and the second voltage value, and a second value associated with a second capacitance charged to the word line capacitance loading between the second voltage value and the third voltage value.

4. The circuit of claim 3,
    wherein the voltage generator comprises a comparing circuit and pumping device, an output of the comparing circuit being the second output of the voltage generator and an output of the pumping device being the first output of the voltage generator, inputs of the comparing circuit being coupled to the first output of the voltage generator and the reference signal, respectively; and wherein:
    in response to the flag signal being equal to 1, the pumping device continues to increase the word line voltage; and
    in response to the flag signal being equal to 0, the pumping device stops increasing the word line voltage.

5. The circuit of claim 4, wherein the sensing device comprises a counter that is coupled to the second output of the voltage generator and counts a time period in response to the flag signal being 1.

6. The circuit of claim 5, wherein:
the third output of the sensing device outputs the first value at an end of a time period that the word line voltage increases from the first voltage value to the second voltage value; and
the third output of the sensing device outputs the second value at an end of a time period that the word line voltage increases from the second voltage value to the third voltage value.

7. The circuit of claim 4, wherein the sensing device comprises flip flops each generating a digit of the value.

8. The circuit of claim 1, wherein the voltage generator and the sensing device are both coupled to a clock signal.

9. A memory device, comprising:
an array of memory cells in memory strings and arranged in rows of memory cells;
word lines respectively coupled to the rows of memory cells; and
a peripheral circuit coupled to the word lines and comprising:
a voltage generator comprising a first output and a second output, the first output being configured to output a word line voltage, and the second output being configured to output a flag signal indicates a relationship between the word line voltage and a reference signal; and
a sensing device comprising a first input and a third output, wherein the first input is coupled to the second output of the voltage generator, and the third output of the sensing device is configured to output a value corresponding to capacitance change of word line capacitance loading based on the flag signal.

10. The memory device of claim 9, wherein:
the voltage generator comprises a pumping device, an output of the pumping device being the first output of the voltage generator; and
the peripheral circuit further comprises a control logic coupled to the pumping device, the control logic being configured to control the pumping device to increase the word line voltage from a first voltage value to a second voltage value, and from the second voltage value to a third voltage value.

11. The memory device of claim 10, wherein the voltage generator further comprises a comparing circuit, an output of the comparing circuit being the second output of the voltage generator, inputs of the comparing circuit being coupled to the first output of the voltage generator and the reference signal, respectively; and wherein:
in response to the flag signal being equal to 1, the pumping device continues to increase the word line voltage; and
in response to the flag signal being equal to 0, the pumping device stops increasing the word line voltage.

12. The memory device of claim 11, wherein the control logic is configured to control the voltage generator to generate the reference signal that has a step voltage and control the pumping device to continue to increase the word line voltage until the flag signal is equal to 0.

13. The memory device of claim 11, wherein the control logic is coupled to the third output of the sensing device and configured to obtain a difference between two adjacent values received from the third output of the sensing device.

14. The memory device of claim 13, wherein the sensing device comprises a counter that is coupled to the second output of the voltage generator and counts a time period in response to the flag signal being 1.

15. The memory device of claim 14, wherein:
the third output of the sensing device outputs a first value at an end of a time period that the word line voltage increases from the first voltage value to the second voltage value; and
the third output of the sensing device outputs a second value at an end of a time period that the word line voltage increases from the second voltage value to the third voltage value.

16. The memory device of claim 13, wherein the control logic is further configured to:
in response to a second difference being equal to or lower than a first difference obtained before the second difference, determine that the word line voltage reaches a highest threshold voltage of the rows of memory cells; and
start other operations based on the highest threshold voltage of the rows of memory cells or a time that the highest threshold voltage of the rows of memory cells is reached.

17. A method for operating a memory device, the memory device comprising an array of memory cells in memory strings and arranged in rows of memory cells, and word lines respectively coupled to the rows of memory cells, the method comprising:
increasing a word line voltage applied on one word line of the word lines;
detecting the word line voltage; and
determining that the word line voltage reaches a highest threshold voltage of the rows of memory cells.

18. The method of claim 17, wherein:
increasing of the word line voltage comprises:
increasing the word line voltage from a first voltage value to a second voltage value, and from the second voltage value to a third voltage value; and
detecting the word line voltage comprises:
obtaining a first value associated with a first capacitance charged to a word line capacitance loading between the first voltage value and the second voltage value, and a second value associated with a second capacitance charged to the word line capacitance loading between the second voltage value and the third voltage value; and
determining a difference between the first value and the second value.

19. The method of claim 18, wherein determining that the word line voltage reaches the highest threshold voltage of the rows of memory cells comprises:
in response to the difference reaching a maximum value, determining that the word line voltage reaches the highest threshold voltage of the rows of memory cells.

20. The method of claim 19, further comprising:
applying a turn-off voltage on a select-gate (SG) transistor coupled to an unselected memory string of the memory strings at a time that the highest threshold voltage of the rows of memory cells is reached.

* * * * *